(12) United States Patent
Sugita et al.

(10) Patent No.: US 9,130,183 B2
(45) Date of Patent: Sep. 8, 2015

(54) ORGANIC ELECTROLUMINESCENT ELEMENT, DISPLAYING DEVICE AND LIGHTING DEVICE

(75) Inventors: Shuichi Sugita, Tokyo (JP); Shunichi Iwamaru, Tokyo (JP); Hiroshi Kita, Tokyo (JP)

(73) Assignee: KONICA MINOLTA, INC. (JP)

( * ) Notice: Subject to any disclaimer, the term of this patent is extended or adjusted under 35 U.S.C. 154(b) by 1009 days.

(21) Appl. No.: 12/063,839

(22) PCT Filed: Jan. 24, 2006

(86) PCT No.: PCT/JP2006/301042
§ 371 (c)(1),
(2), (4) Date: Feb. 14, 2008

(87) PCT Pub. No.: WO2007/020718
PCT Pub. Date: Feb. 22, 2007

(65) Prior Publication Data
US 2009/0033213 A1 Feb. 5, 2009

(30) Foreign Application Priority Data

Aug. 18, 2005 (JP) ................................. 2005-237121

(51) Int. Cl.
*H01J 1/63* (2006.01)
*H01L 51/50* (2006.01)
*H01L 51/00* (2006.01)

(52) U.S. Cl.
CPC .......... *H01L 51/5016* (2013.01); *H01L 51/0067* (2013.01); *H01L 51/0072* (2013.01); *H01L 51/0081* (2013.01)

(58) Field of Classification Search
CPC .................................. H01L 51/0072
USPC ........................................................ 313/504
See application file for complete search history.

(56) References Cited

U.S. PATENT DOCUMENTS 5,965,907 A * 10/1999 Huang et al. .................. 313/506
6,097,147 A 8/2000 Baldo et al.
(Continued)

FOREIGN PATENT DOCUMENTS

JP 10-284248 A 10/1998
JP 2002-38142 A 2/2002
(Continued)

OTHER PUBLICATIONS

Journal of Applied Physics / vol. 84 / Issue 7 / Cross-Disciplinary Physics (PACS 81-98) J. Appl. Phys. 84, 4013 (1998); Accurate thickness/density measurements of organic light-emitting diodes; C. H. M. Marée1, R. A. Weller1, L. C. Feldman1, K. Pakbaz2, and H. W. H. Lee2; (Received Aug. 8, 1997; accepted Jul. 7, 1998).*

(Continued)

*Primary Examiner* — Thomas A Hollweg
*Assistant Examiner* — Jacob R Stern
(74) *Attorney, Agent, or Firm* — Cantor Colburn LLP

(57) ABSTRACT

This invention provides an organic electroluminescent element comprising a substrate and an electrode and one or more organic layers provided on the substrate. The organic electroluminescent element is characterized in that the layer density of at least one of the organic layers is 1.10 to 1.25 g/cm$^3$. The organic electroluminescent element exhibits good luminescence brightness, causes no significant voltage rise and dark spot in the constant-current driving, and has good temporal stability under high temperature and high humidity conditions. There are also provided a display device and a lighting device using the organic EL element.

16 Claims, 3 Drawing Sheets

(56) References Cited

U.S. PATENT DOCUMENTS

| | | | |
|---|---|---|---|
| 6,687,266 B1* | 2/2004 | Ma et al. | 372/7 |
| 7,128,982 B2* | 10/2006 | Oshiyama et al. | 313/504 |
| 2004/0160167 A1* | 8/2004 | Arai et al. | 313/500 |
| 2005/0156520 A1* | 7/2005 | Tanaka et al. | 313/504 |
| 2006/0024522 A1* | 2/2006 | Thompson | 428/690 |

FOREIGN PATENT DOCUMENTS

| | | | |
|---|---|---|---|
| JP | 2002-100476 A | | 4/2002 |
| JP | 2002-117978 A | | 4/2002 |
| JP | 2002-299061 A | | 10/2002 |
| JP | 2003-272827 A | | 9/2003 |
| JP | 2004-6287 A | | 1/2004 |
| JP | 2004-127557 A | | 4/2004 |
| JP | 2004-253179 A | | 9/2004 |
| JP | 2004-303483 A | | 10/2004 |
| JP | 2005-508515 A | | 3/2005 |
| WO | 03/038923 A1 | | 5/2003 |
| WO | WO 2004085450 A2 | * | 10/2004 |
| WO | 2004/095889 A1 | | 11/2004 |
| WO | 2005/004549 A1 | | 1/2005 |
| WO | 2005/039246 A1 | | 4/2005 |

OTHER PUBLICATIONS

Web search for density of NPD Oct. 19, 2011.*
International Search Report for International Application No. PCT/JP2006/301042 mailed Mar. 14, 2006.
M.A. Baldo, et al., "Highly Efficient Phosphorescent Emission from Organic Electroluminescent Devices", Nature, vol. 395, Sep. 10, 1998, pp. 151-154.
M.A. Baldo, et al., "High-Efficiency Fluorescent Organic Light-Emitting Devices using a Phosphorescent Sensitizer", Nature, vol. 403, Feb. 17, 2000, pp. 750-753.
Sergey Lamansky, et al., "Highly Phosphorescent Bis-Cyclometalated Iridium Complexes: Syntheses, Photophysical Characterization, and Use in Organic Light Emitting Diodes", J. American Chemical Society 2001, 123, pp. 4304-4312.
Examiner's Decision of Refusal for Patent Application No. 2007-530906, drafted Mar. 29, 2012, with English translation.
Inamur R. Laskar, et al. "Investigating photoluminescence and electroluminescence of iridium(III)-based blue-emitting phosphors", Polyhedron 25 (2006) 1167-1176.
Paul J. Low et al., "Towards an understanding of structure-property relationships in hole-transport materials: The influence of molecular conformation on oxidation potential in poly(aryl)amines", Journal of Materials Chemistry, 2005, 15, 2304-2315.

* cited by examiner

ORGANIC ELECTROLUMINESCENT ELEMENT, DISPLAYING DEVICE AND LIGHTING DEVICE

CROSS REFERENCE TO RELATED APPLICATIONS

This is a U.S. national stage of application No. PCT/JP2006/301042, filed on 24 Jan. 2006. Priority under 35 U.S.C. §119(a) and 35 U.S.C. §365(b) is claimed from Japanese Application No. 2005-237121, filed 18 Aug. 2005, the disclosure of which is also incorporated herein by reference.

TECHNICAL FIELD

This invention relates to an organic electroluminescent element, a displaying device and a lighting device using the organic electroluminescent element.

TECHNICAL BACKGROUND

Hitherto, electroluminescent displays (ELD) have been used as light emission type electronic displaying device. As the element constituting the ELD, inorganic electroluminescent elements and organic electroluminescent elements, hereinafter referred to as organic EL element, can be cited.

The organic EL element has a constitution in which a light emission layer is placed between a cathode and an anode and the element emits light by utilizing the light emission (fluorescence or phosphorescence) caused by quenching of exciton generated by recombination of an electron and a positive hole injected from the electrodes to the light emission layer. The organic EL elements can emit light by applying a voltage of from several volt to several ten volt, and such the element is noted from the viewpoint of that the element gives wide viewing angle and high visibility because the element is self light emission type and further gives high portability and space saving since the element is a thin layer type complete solid state element.

Recently, an organic EL element using phosphorescent light emitted from the triplet excited state is reported by Princeton University; cf. Non-patent Publication 1, and the investigation on the material emitting phosphorescence at room temperature is accelerated; cf. Non-patent Publication 2 and Patent publication 1 for example. When the triplet excited state is utilized, the upper limit of the internal quantum efficiency becomes 100%. Therefore, the light emission efficiency is theoretically raised by four times of that of the singlet excited state so that performance almost the same as that of a cathode ray tube can be obtained. Consequently, such the element is noted since which can be used for purpose of lighting. For example, synthesizing of many compounds principally heavy metal complexes such as iridium complexes have been carried out; cf. Non-patent Publication 3 for example.

At present, investigation for further rising the light emission efficiency and the life timer thereof is carried out; cf. Patent Publications 2 and 3 for example. Though a taking out efficiency of green light of 20% which is theoretical limit of the efficiency can be attained, sufficient taking out efficiency cannot be obtained regarding the other color light and improvement is required. Particularly, an element capable of emitting blue light with high efficiency is required and a compound having larger band gap is demanded.

The organic light emitting element realizing high luminance light emission is an element constituted by laminating organic substance layers by vapor deposition method, however, a production by coating method is disclosed for simplifying the production process, rising the processing suitability and increasing the product area; cf. Patent Publication 4 for example.

However, improvement in the voltage rising during the constant electric current driving and occurrence of dark spots, and durability under high temperature and high humidity condition is required to the conventional organic EL elements. Further improvement in the luminance of emitted light is also demanded.

Patent Publication 1: U.S. Pat. No. 6,097,147
Patent Publication 2: Tokkai 2002-100476
Patent Publication 3: Tokkai 2002-117978
Patent Publication 4: Tokkai 2002-299061
Non-patent Publication 1: M. A. Baldo et al., Nature, 395 pp. 151-154 (1998)
Non-patent Publication 2: M. A. Baldo et al., Nature, 403, 17, pp. 750-753 (2000)
Non-patent Publication 3: S. Lamansky et al., J. Am. Chem. Soc., 123, 4304 (2001)

DISCLOSURE OF THE INVENTION

Problems to be Solved by the Invention

The invention is carried out on the above background, and an object of the invention is to provide an organic EL element which is reduced in the rising of voltage during constant electric current driving and occurrence of dark spots and shows high stability in aging change, and a displaying device and a lighting device using the organic EL element.

Means for Solving the Problems

The object of the invention can be attained by the following constitution.

1. An organic electroluminescent element having an electrode and at least one or more organic layers provided on a substrate, wherein the density of at least one of the organic layers is from 1.10 to 1.25 g/cm$^3$.

2. The organic electroluminescent element described in the above 1, wherein at least one of the organic layers is a light emission layer which contains a dopant and a host compound having a band gap of from 2.5 to 3.8 eV.

3. The organic electroluminescent element described in the above 2, wherein the dopant is a phosphorescent compound and the light emission layer contains the host compound having a band gap of from 2.9 to 3.8 eV.

4. The organic electroluminescent element described in the above 2, wherein the host compound has a band gap of from 3.45 to 3.65 eV.

5. The organic electroluminescent element described in the above 1, wherein the at least one of the organic layers has a density of from 1.20 to 1.25 g/cm$^3$.

6. The organic electroluminescent element described in the above 5, wherein the host compound has a molecular weight of from 400 to 2,000.

7. The organic electroluminescent element described in the above 1, wherein at least one of the organic layers has a density of from 1.10 to 1.15 g/cm$^3$.

8. The organic electroluminescent element described in the above 7, wherein the host compound has a molecular weight of from 5,000 to 1,000,000.

9. The organic electroluminescent element described in the above 1, wherein the organic layer contains from $10^{-2}$ to $10^3$ ppm of an organic solvent.

10. The organic electroluminescent element described in the above 1, wherein the substrate has a gas barrier layer.

11. The organic electroluminescent element described in the above 1, wherein the light emitted from the element is red.

12. The organic electroluminescent element described in the above 1, wherein the light emitted from the element is green.

13. The organic electroluminescent element described in the above 1, wherein the light emitted from the element is blue.

14. The organic electroluminescent element described in the above 1, wherein the light emitted from the element is white.

15. A displaying device having the organic electroluminescent element described in the above 1.

16. A lighting device having the organic electroluminescent element described in the above 1.

17. A displaying device having the lighting device described in the above 16 and a liquid crystal element as the displaying means.

Effect of the Invention

The organic EL element which is reduced in the rising of voltage during constant electric current driving and occurrence of dark spots and shows high stability in aging change, and the displaying device and lighting device using the organic EL element can be provided by the invention.

DESCRIPTION OF SYMBOLS

Figure 1:
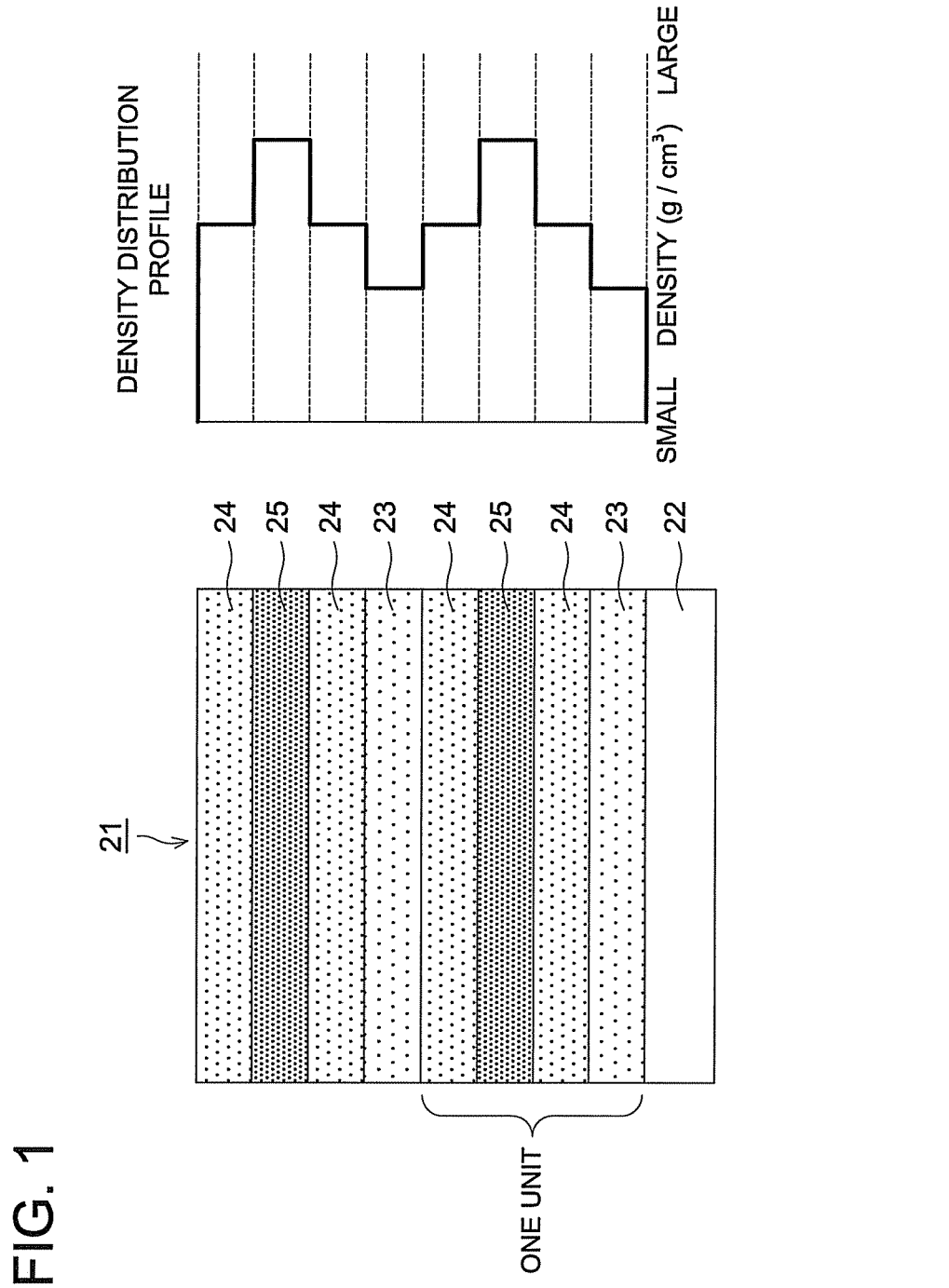
FIG. 1 shows a schematic drawing of an example of the constitution of a transparent gas barrier film and a density profile thereof.

1: Display
3: Pixel
5: Scanning line
6: Data line
10: Ink-jet head
21: Gas barrier layer
22: Substrate
23: Contacting layer
24: Ceramic layer
25: Protection layer
30: Plasma treating chamber
35: Roller electrode
36: Electrode
41, 42: Power source
51: Gas supplying device
55: Electrode cooling device
100: ITO substrate
111: Positive hole transfer layer
112: Electron transfer layer
113: Cathode
114: Gas barrier layer
A: Displaying portion
B: Controlling means
C: Droplet

THE BEST EMBODIMENT FOR EMBODYING THE INVENTION

The inventors found that the organic EL element showing high luminance light emission which is reduced in the voltage rising during constant electric current driving and occurrence of dark spots and has high stability in aging change under high temperature and high humidity condition can be obtained by an organic EL element having an electrode and at least one or more organic layers provided on a substrate and the density of at least one of the organic layers is 1.10 to 1.25 g/cm$^3$.

The constitution matters of the invention are each described in detail below.

(Layer Density)

The layer density in the invention can be determined by an X-ray reflectivity measuring method. The layer density is determined by measuring reflectivity at an extremely low angle such as 0.2° to 2° and fitting the reflectivity curve thus obtained to the expression of reflectivity of multilayered sample conducted from Fresnel expression. L. G. Parratt, Phys. Rev., 95, 359 (1954) can be referred for the fitting method.

In concrete, an X-ray source using copper target is worked at 50 kV and 300 mA. The X-ray monochromized by a multilayered mirror and a Ge(111) channel-cut monochrometer is used for the measurement. In the measurement, software ATX-Crystal Guide Ver. 6.5.3.4 was used and 20% of from 0° to 1° was scanned at 0.002°/step and 0.05°/min after half cutting and alignment adjusting. After the measurement of reflectivity curve under the above conditions, the layer density is determined by an analyzing software GXRR Ver. 2.1.0.0 manufactured by Rigaku Corp.

The density of at least one of the organic layers is from 1.10 to 1.25 g/cm$^3$ and the rising in the voltage at the constant electric current driving, occurrence of the dark spots and the stability in aging change under high temperature and high humidity condition are improved when the layer density is within the above range. The layer density is more preferably from 1.20 to 1.25 g/cm$^3$ or 1.10 to 1.15 g/cm$^3$.

(Band Gap)

In the invention, the band gap is difference between the ionization potential and the electron affinity of the compound. The ionization potential is defined by the energy necessary for releasing an electron being at the highest occupied molecular orbital (HOMO) to the vacuum level and the electron affinity is defined by the energy for stabilizing an electron being at the vacuum level by falling to the lowest unoccupied molecular orbital (LUMO) of a substance.

The band gap is determined by measuring absorption spectrum of a vapor deposited layer of 100 nm of the organic compound formed on a glass plate and converting the end wavelength Y nm of the spectrum to X eV according to the following converting expression.

$$Y=10^7/(8065.541 \times X)$$

In concrete, the value was determined by a low energy electron spectrometer Model AC-1, manufactured by Riken Keiki Co., Ltd.

(Organic Solvent Content)

Measuring method of organic solvent content is described below.

Organic solvent remaining in the organic layer relating to the invention can be measured by a gas chromatography weight analysis method (PT-GC/MS) having a purge and trap sampler. In concrete, the measurement can be carried out by preparing an organic EL element of 10 cm square and absorbing the remaining organic solvent to a gas discovering chamber and an organic gas absorbing tube. The solvent concentration is determined according to a calibration curve prepared by using a standard sample having known concentration.

The organic layer relating to the invention preferably contains the organic solvent in an amount of from $10^{-2}$ to $10^{3}$ ppm. Preferable content of the organic solvent is from 0.1 to 100 ppm and the voltage rising at the constant electric current driving, the occurrence of dark spots and stability in aging change under high temperature and high humidity condition are further improved by such the organic solvent content.

The organic solvent to be used in the invention is not specifically limited and examples of that include alcohols such as methanol and ethanol, carboxylic acid esters such as ethyl acetate and propyl acetate, nitrites such as acetonitrile, ethers such as isopropyl ether and THF, aromatic hydrocarbons such as cyclohexylbenzene, toluene and xylene, alkyl halides such as methylene chloride and saturated hydrocarbons such as heptane. Among them, the carboxyl acid esters, nitriles, ethers, aromatic hydrocarbons, alkyl halides and saturated hydrocarbons are preferable and the carboxylic acid esters, ethers and aromatic hydrocarbons are more preferable.

The boiling point of the organic solvent to be used in the invention is preferably not more than 200° C. and more preferably not more than 150° C.

The organic layer relating to the invention is formed by a vapor deposition method or a coating method. The coating method includes a spin-coat, dip-coat, roller-coat, bar-coat, flexso printing, screen printing offset printing, and ink-jet method, and the ink-jet method is preferable.

(Host Compound)

The host compound to be used in the invention is described below.

In the invention, the host compound is defined as a compound having a quantum efficiency of phosphorescent light emission of less than 0.01 at room temperature (25° C.) among compounds contained in a light emission layer.

The band gap of the host compound to be used in the invention is preferably from 2.5 to 3.8 eV. The band gap is more preferably from 2.9 to 3.8 eV and further preferably from 3.45 to 3.65 eV, the improvement in the luminance of emitting light is further enhanced by the compound having such the band gap.

Examples of the host compound to be used in the invention include carbazole derivatives, azacarbazole derivatives, triazole derivatives, oxadiazole derivatives, imidazole derivatives, polyarylalkane derivatives, pyrazoline derivatives, pyrazolone derivatives, phenylenediamine derivatives, arylamine derivatives, phenanthroline derivatives, styrylanthracene derivatives, fluorenone derivatives, hydrazone derivatives, stilbene derivatives, organic metal compounds and arylmethane derivatives.

Among them, compounds represented by the following Formulas (1), (3) to (5) are more preferable.

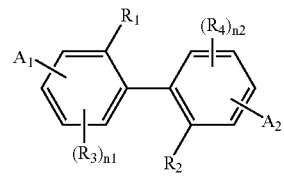

Formula (1)

In the formula, $R_1$ to $R_4$ are each a substituent. n1 and N2 are each an integer of from 0 to 3. $A_1$ and $A_2$ are each a compound represented by the following Formula (2).

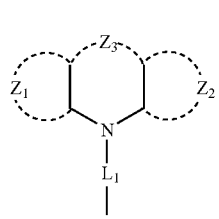

Formula (2)

In the formula, $Z_1$ and $Z_2$ are each an aromatic heterocyclic ring or an aromatic hydrocarbon ring each may have a substituent, and $Z_3$ is a di-valent linking group or a single bond. $L_1$ is a di-valent linking group or a single bond.

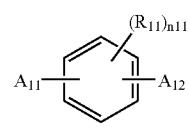

Formula (3)

In the formula, $R_{11}$ is a substituent. n11 is an integer of from 0 to 4. $A_{11}$ and $A_{12}$ are each a compound represented by the above Formula (2).

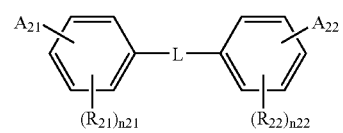

Formula (4)

In the formula, $R_{21}$ and $R_{22}$ are each a substituent. n21 and n22 are each an integer of from 0 to 3. $A_{21}$ and $A_{22}$ are each a compound represented by Formula (2). L is a di-valent linking group.

Among Formulas (1), (3) and (4), Formula (2) in which $Z_1$ and $Z_2$ are each an aromatic hydrocarbon is more preferable.

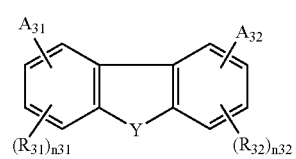

Formula (5)

In the formula, $A_{31}$ and $A_{32}$ are each a substituent. n31 and n32 are each an integer of from 0 to 3. Y is an oxygen atom, a sulfur atom, an imino group, a sulfoxide group or a sulfonyl group. $R_{31}$ and $R_{32}$ are each a compound represented by Formula (2).

In Formulas (1), (3), (4) and (5), examples of the substituent represented by $R_1$ to $R_4$, $R_{11}$, $R_{21}$ to $R_{24}$, $R_{31}$ and $R_{32}$ include alkyl groups, preferably ones having 1 to 20 carbon atoms, more preferably having 1 to 12 carbon atoms and particularly preferably 1 to 8 carbon atoms such as a methyl group, an ethyl group, an iso-propyl group, a tert-butyl group, an n-octyl group, an n-decyl group, an n-hexadecyl group, a cyclopropyl group, a cyclopentyl group and a cyclohexyl group; alkenyl groups preferably ones having 2 to 20 carbon atoms, more preferably having 2 to 12 carbon atoms and particularly preferably 2 to 8 carbon atoms such as a vinyl group, an allyl group, a 2-butenyl group and a 3-pentenyl group; alkynyl groups preferably ones having 2 to 20 carbon atoms, more preferably having 2 to 12 carbon atoms and particularly preferably 2 to 8 carbon atoms such as a propalgyl group and a 3-pentynyl group; aryl groups preferably ones having 6 to 30 carbon atoms, more preferably having 6 to 20 carbon atoms and particularly preferably 6 to 12 carbon atoms such as a phenyl group, a p-methylphenyl group and a naphthyl group; amino groups preferably ones having 0 to 20 carbon atoms, more preferably 0 to 10 carbon atoms and particularly preferably 0 to 6 carbon atoms such as an amino group, a methylamino group, a dimethylamino group, a diethylamino group and dibenzylamino group; alkoxy groups preferably ones having 1 to 20 carbon atoms, more preferably 1 to 12 carbon atoms and particularly preferably 1 to 8 carbon atoms such as a methoxy group, an ethoxy group and a butoxy group; aryloxy groups preferably ones having 6 to 20 carbon atoms, more preferably 6 to 16 carbon atoms and particularly preferably 6 to 12 carbon atoms such as a phenyloxy group and a 2-naphthyloxy group; acyl groups preferably ones having 1 to 20 carbon atoms, more preferably 1 to 16 carbon atoms and particularly preferably 1 to 12 carbon atoms such as an acetyl group, a benzoyl group, a formyl group and pivaloyl group; alkoxycarbonyl groups preferably ones having 2 to 20 carbon atoms, more preferably 2 to 16 carbon atoms and particularly preferably 2 to 12 carbon atoms such as a methoxycarbony group and an ethoxycarbonyl group; aryloxycarbonyl groups preferably ones having 7 to 20 carbon atoms, more preferably 7 to 16 carbon atoms and particularly preferably 7 to 10 carbon atoms such as a phenyloxycarbonyl group; acyloxy groups preferably ones having 2 to 20 carbon atoms, more preferably 2 to 16 carbon atoms and particularly preferably 2 to 10 carbon atoms such as an acetoxy group and a benzoyloxy group; acylamino groups preferably ones having 2 to 20 carbon atoms, more preferably 2 to 16 carbon atoms and particularly preferably 2 to 10 carbon atoms such as an acetylamino group and a benzoylamino group; alkoxycarbonylamino group preferably ones having 2 to 20 carbon atoms, more preferably 2 to 16 carbon atoms and particularly preferably 2 to 12 carbon atoms such as a methoxcarbonylamino group; arylaminocarboxyamino groups preferably ones having 7 to 20 carbon atoms, more preferably 7 to 16 carbon atoms and particularly preferably 7 to 12 carbon atoms such as a phenyloxycarbonylamino group; sulfonylamino group preferably ones having 1 to 20 carbon atoms, more preferably 1 to 16 carbon atoms and particularly preferably 1 to 12 carbon atoms such as a methanesulfonylamino group and a benzenesulfonylamino group; sulfamoyl groups preferably ones having 0 to 20 carbon atoms, more preferably 0 to 16 carbon atoms and particularly preferably 0 to 12 carbon atoms such as a sulfamoyl group, a methylsulfamoyl group, a dimethylsulfamoyl group and phenylsulfamoyl group; carbamoyl groups preferably ones having 1 to 20 carbon atoms, more preferably 1 to 16 carbon atoms and particularly preferably 1 to 12 carbon atoms such as a carbamoyl group, a methylcarbamoyl group, a diethylcarbamoyl group and a phenylcarbamoyl group; alkylthio groups preferably ones having 1 to 20 carbon atoms, more preferably 1 to 16 carbon atoms and particularly preferably 1 to 12 carbon atoms such as a methylthio group and an ethylthio group; arylthio group preferably ones having 6 to 20 carbon atoms, more preferably 6 to 16 carbon atoms and particularly preferably 6 to 12 carbon atoms such as a phenylthio group; sulfonyl groups preferably ones having 1 to 20 carbon atoms, more preferably 1 to 16 carbon atoms and particularly preferably 1 to 12 carbon atoms such as a mesyl group and a tosyl group; sulfinyl groups preferably ones having 1 to 20 carbon atoms, more preferably 1 to 16 carbon atoms and particularly preferably 1 to 12 carbon atoms such as a methanesulfinyl group and a benzenesulfinyl group: ureido group preferably ones having 1 to 20 carbon atoms, more preferably 1 to 16 carbon atoms and particularly preferably 1 to 12 carbon atoms such as an ureido group, a methylureido group and a phenylureido group; phosphoramide groups preferably ones having 1 to 20 carbon atoms, more preferably 1 to 16 carbon atoms and particularly preferably 1 to 12 carbon atoms such as a diethylphosphoramide group and a phenylphosphoramide group; a hydroxyl group; a mercapto group; halogen atoms such as a fluorine atom, a chlorine atom, a bromine atom and an iodine atom; a cyano group; a sulfo group; a carboxy group; a nitro group; a hydroxamic acid group; a sulfino group; a hydrazino group; an imino group; and heterocyclic groups including ones having a nitrogen atom, an oxygen atom, a sulfur atom or a selenium atom and preferably having 1 to 30 carbon atoms and more preferably 1 to 20 carbon atoms such as a imidazolyl group, a pyridyl group, a furyl group, a piperidyl group and a morpholino group. These substituents may further have a substituent. The substituents may be linked to form a ring when it is possible.

Among them, the alkyl groups and aryl groups are most preferable.

The di-valent linking group represented by L and $L_1$ in Formulas 2 and 4 may be a hydrocarbon group such as an alkylene group, an alkenylene group and an arylene group, a group including a hetero atom, or one derived from a compound having a heterocyclic ring (so called also as an aromatic heterocyclic compound) such as a thiophene-2,5-diyl group and a pyrazine-2,3-diyl group, a charcogen atom such as an oxygen atom and a sulfur atom, or a group linking through a hetero atom such as an alkylimino group, a dialkylsilanediyl group and a diarylgermandiyl group.

Both of a low molecular weight compound and a high molecular weight compound can be used for the host compound to be used in the invention. As the low molecular weight compound, ones having a molecular weight of from 400 to 2,000 are preferable.

When the low molecular weight compound is used, it is more preferable that the density of at least one of the organic layers is from 1.20 to 1.25 g/cm$^3$ and the molecular weight of the compound is from 400 to 2,000. The voltage rising during the constant electric current driving and the stability in aging change are further improved by that.

The high molecular is a compound formed by polymerization of a compound (polymerizable compound) having at least one polymerizable group. As the polymerizable group, a vinyl group, an epoxy group, an oxetane group, an isocyanate group and a thioisocyanate can be cited. Among them, the vinyl group is preferred. The organic compounds represented by Formulas (1) to (5) relating to the invention may have such the polymerizable group at any position in the molecular thereof.

Polymerization reaction of the polymerizable compound is described below. On the occasion of formation of the polymer, the polymer is formed may be that previously synthesized polymer is used, the polymer is polymerized in a solution before the preparation of the element or at the time of preparation of the element. Moreover, the polymerization may be carried out after preparation of the element. For beginning the polymerization, energy such as heat, light and ultrasonic wave may be supplied, and a polymerization initiator, an acid catalyst or a basic catalyst may be added for beginning the reaction. Besides, the reaction may be carried out by electric current for driving the light emitting element or light or heat generated by driving when the polymerization is carried out by containing the compound in the light emitting element. Two or more kinds of polymerizable compound may be polymerized for forming a copolymer.

The molecular weight of the polymerized high molecular weight compound is preferably from 5,000 to 1,000,000 (weight average molecular weight) and more preferably from 5,000 to 200,000.

It is more preferable that the layer density is from 1.10 to 1.15 g/cm$^3$ and the molecular weight is 5,000 to 1,000,000. The voltage rising during the constant electric current driving and the stability in aging change are further improved by that.

Examples of the radical polymerization initiator include azo type initiators such as 2,2'-azobisbutylonitrile, 2,2'-azobiscyclohexane-carbonitrile, 1,1'-azobis(cyclohexane-1-carbonitrile), 2,2'-azobis(2-methylbutylonitrile), 2,2'-azobis(2,4-dimethylveleronitrile), 2,2'-azobis(4-methoxy-2,4-dimethylvaleronitrile), 4,4'-zaobis(4-cyanovaleric acid), 2,2'-azobisdimethyl butylate, 2,2'-azobis(2-methylpropionamidoxime), 2,2'-azobis(2-(2-imidazoline-2-yl)propane) and 2,2'-azobis(2,4,4-trimethylpentane); peroxide type initiators such as benzoyl peroxide, di-t-butyl peroxide, t-butyl hydroperoxide and cumene hydroperoxide; and aromatic carbonyl type initiators such as diethoxyacetophenone, 2-hydroxy-2-methyl-1-phenylpropane-1-one, benzyldimethylketal, benzyl-β-methoxyethylacetal, 1-(4-isopropylphenyl)-2-hydroxy-2-methylpropane-1-one, 4-(2-hydroxyethoxy)phenyl-(2-hydroxy-2-propyl) ketone, 1-hydroxycyclohexylphenyl ketone, 4-phenoxydichloroacetophenone, 4-t-butyldichlroacetophenone, 4-t-butyltrichlroacetophenone and 1-(4-dodecy;phenyl)-2-hydroxy-2-methylpropane-1-one. Moreover, disulfide type initiators such as tetraethylthiirum disulfide; nitoxyl type initiators such as 2,2,6,6-tetranitropiperidine-1-oxyl; and living radical type polymerization initiators such as 4,4'-di-t-butyl-2,2'-bipyridine copper complex-methyl trichloroacetate composite are usable.

As the acid catalyst, various substances, for example, clay such as active clay and acid clay; mineral acids such as sulfuric acid and hydrochloric acid; organic acids such as p-toluenesulfonic acid and trifluoroacetic acid; Lewis acid such as aluminum chloride, ferric chloride, tin(IV) chloride, titanium trichloride, titanium tetrachloride, boron trifluoride, aluminum bromide, gallium chloride and gallium bromide; solid acids such as zeolite, silica, alumina, silica•alumina, cationic ion exchanging rasin; and hetero polyacids such as phosphotungustic acid, phosphomolybdic acid, silicotungstic acid and silicomolybdic acid are usable.

As the basic catalyst, alkali metal carbonates such as $Li_2CO_3$, $Na_2CO_3$ and $K_2CO_3$; alkali-earth metal carbonates such as $BaCO_3$ and $CaCO_3$; alkali metal oxides such as $LiO_2$, $Na_2O$ and $K_2O$; alkali-earth metal oxides such as BaO and CaO; alkali metals such as Na and K; alkali metal hydroxides such as sodium hydroxide and potassium hydroxide; and alkoxides such as that of sodium, potassium, rubidium and cesium are cited.

Concrete examples of the host compound preferably to be used in the invention are listed below, though the host compound is not limited to them.

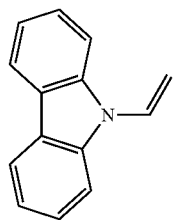

A1

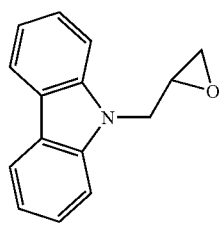

A2

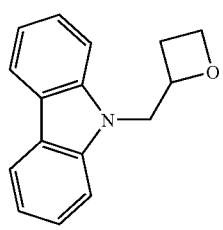

A3

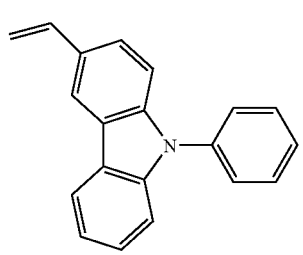

A4

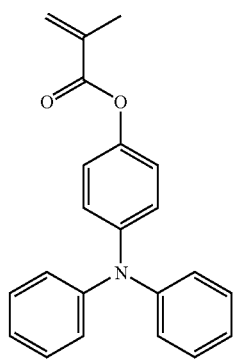

A5

A6 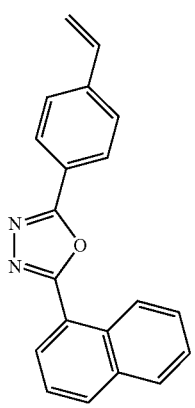
A7 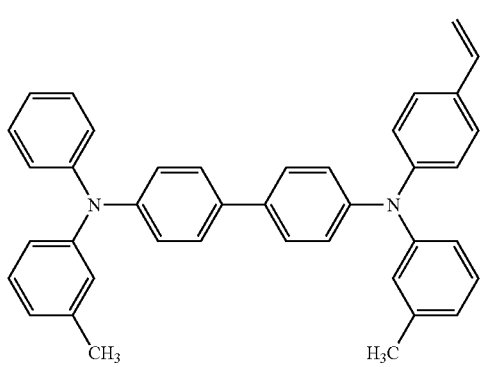
A8 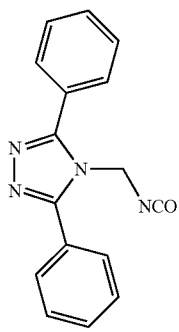
A9 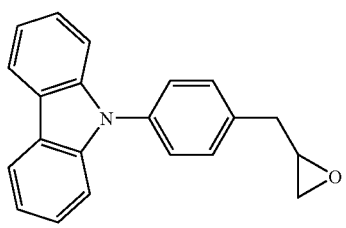
A10 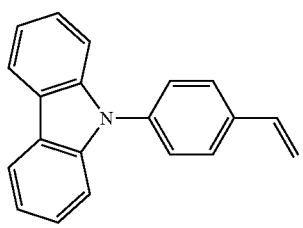
A11 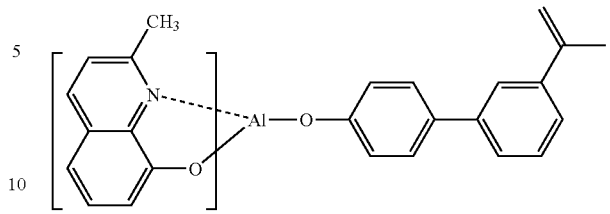
A12 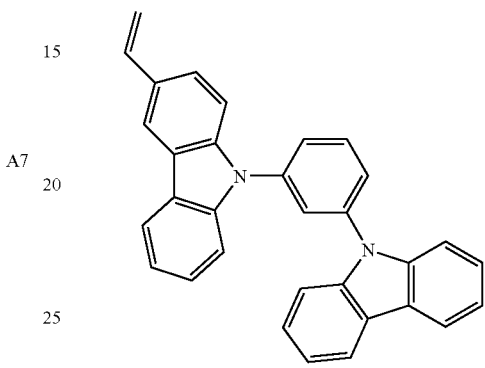
A13 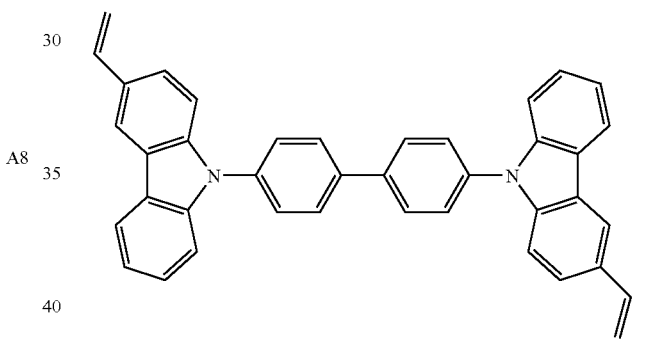
A14 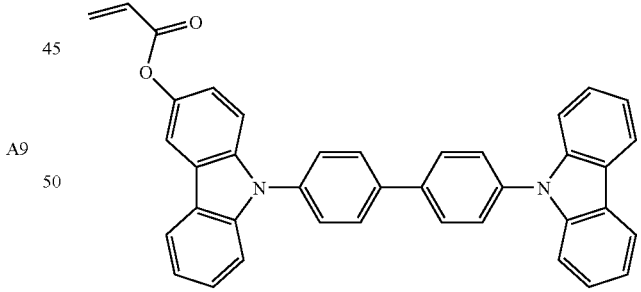
A15 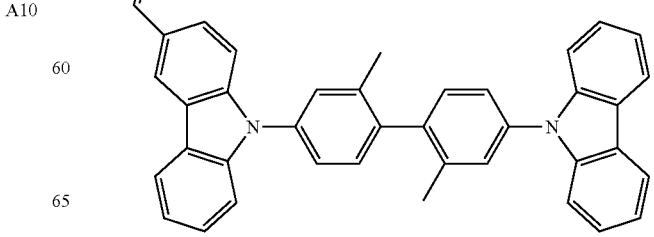

A16
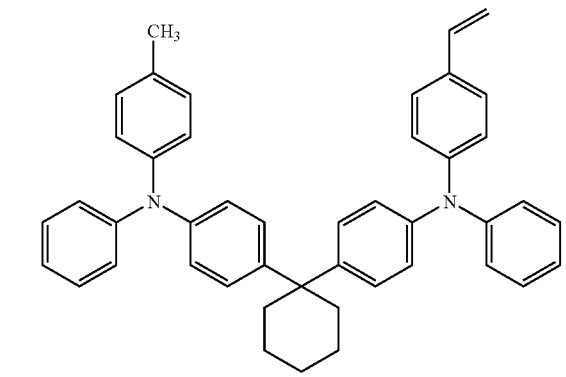
A17
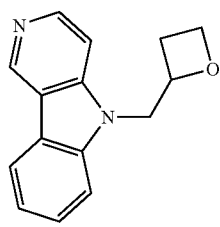
A18
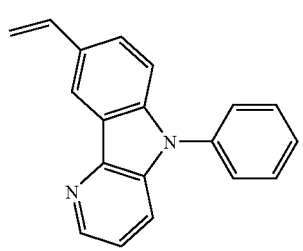
A19
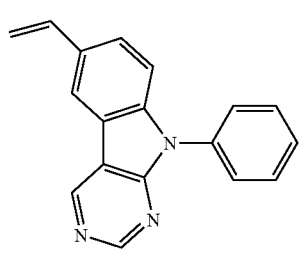
A20
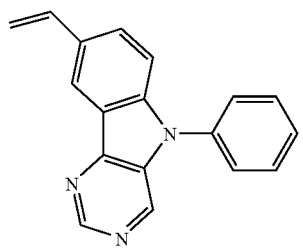
A21
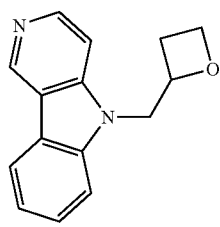
A22
A23
A24
A25
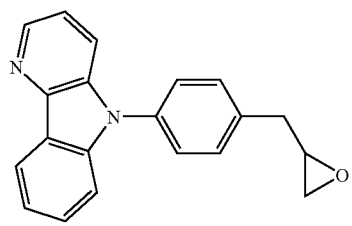
A26
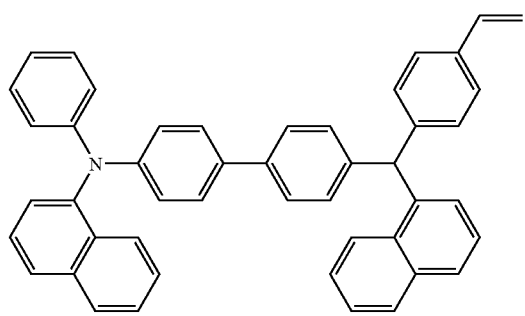

A27
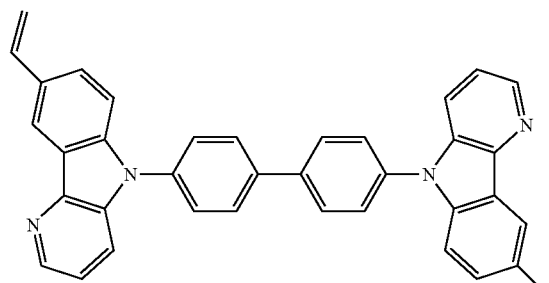
A28
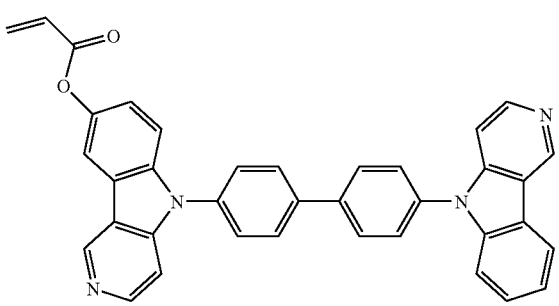
A29
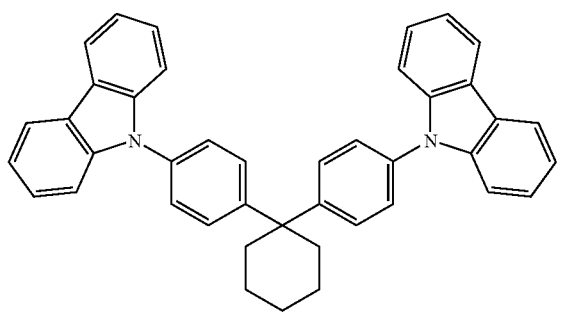
A30
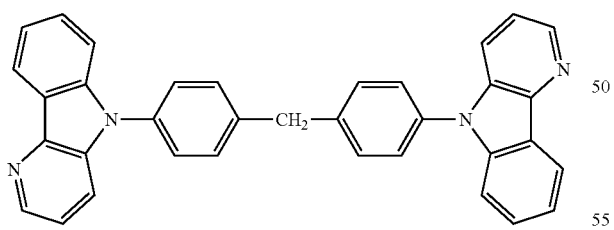
A31
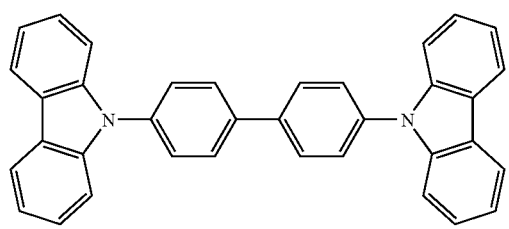
A32
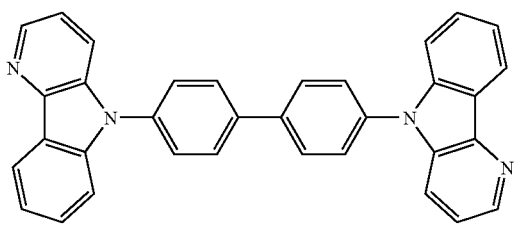
A33
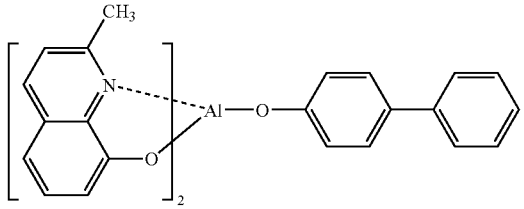
A34
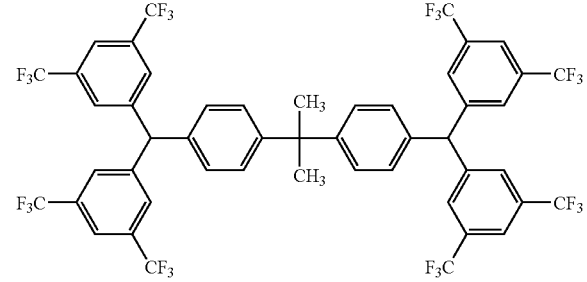
A35
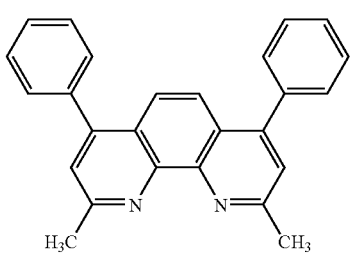
A36
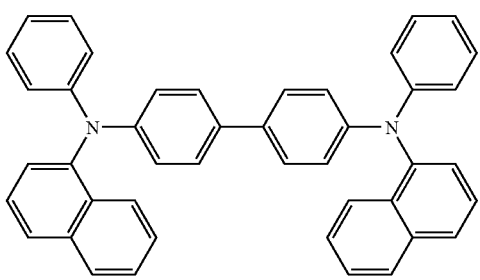
A37
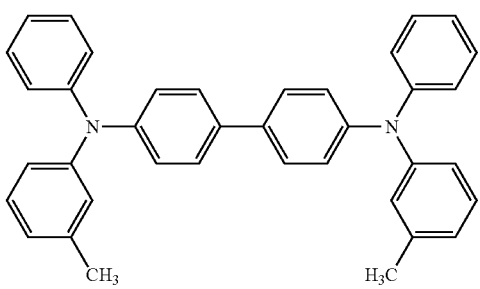

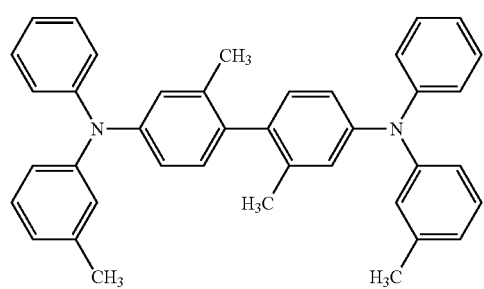
A38
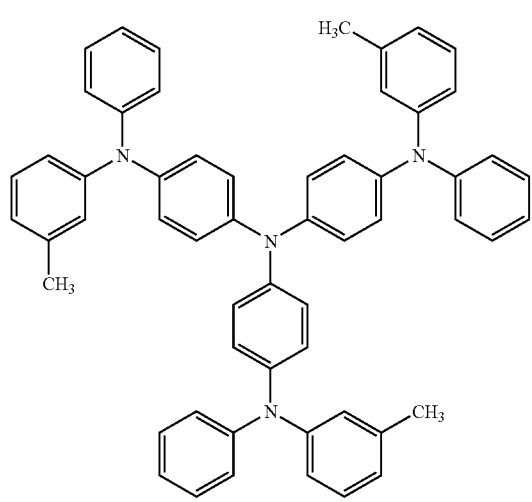
A39
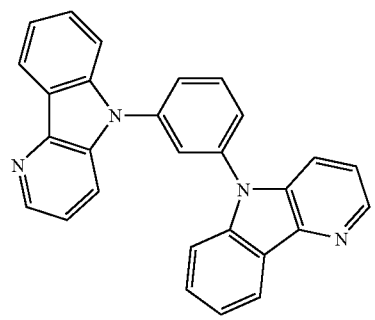
A40
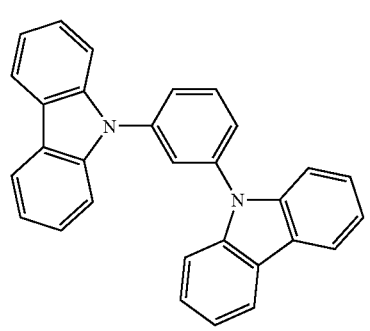
A41
A42
A43
A44

-continued

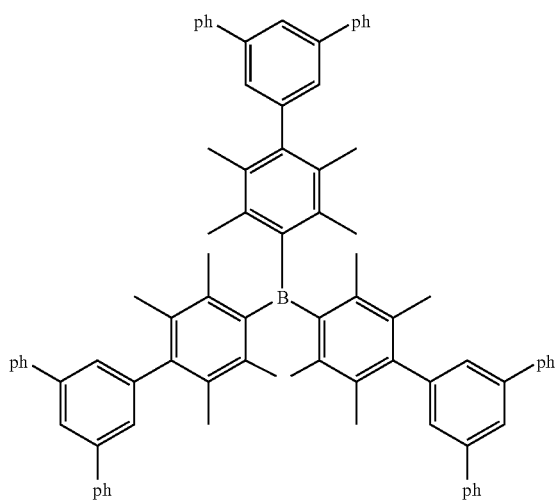

A45

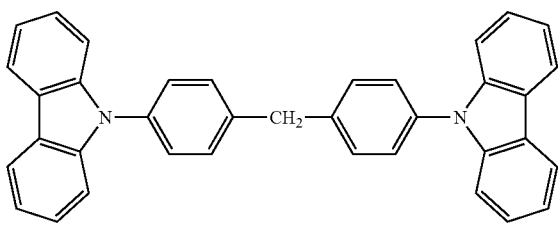

A46

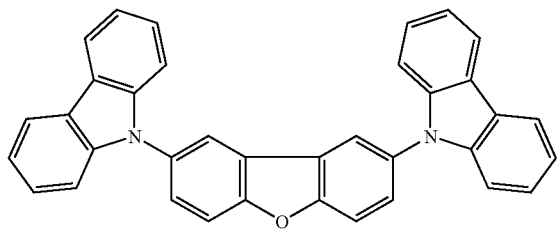

A47

(Dopant)

The dopant to be used in the invention is described below.

The dopant to be used in the invention is a fluorescent compound or a phosphorescent compound, and the phosphorescent compound is preferred.

The phosphorescent compound in the invention is a compound which shows light emission from triplet excited state and the phosphorescent quantum efficiency of which is not less than 0.001 at 25° C. The phosphorescent quantum efficiency is preferably not less than 0.01 and more preferably not less than 0.1. The phosphorescent quantum efficiency can be measured by the method described in "Course of Experimental Chemistry (Jikkenn Kagaku Koza), $4^{th}$ Edition, Spectroscopy II" p. 398, (1992) Maruzen Co., Ltd. For measuring the phosphorescent quantum efficiency in a solution state, various kinds of solvent can be used and it is allowed that the phosphorescent compound to be used in the invention satisfies the above phosphorescent quantum efficiency in any one of the solvent.

As the phosphorescent compound to be used in the invention, complex compounds containing a metal of Group VIII of the periodic table of element are preferable and iridium compounds, osmium compounds and platinum compounds (platinum complex compounds) are more preferable and the iridium compounds are most preferable.

Concrete examples of the phosphorescent compound to be used in the invention are listed below, although the compound is not limited to them. These compounds can be synthesized by the method described in Inorg. Chem., 40, 1704 to 1711, for example. The fluorescent compounds and the phosphorescent compounds to be contained may have a reactive group or no reactive group.

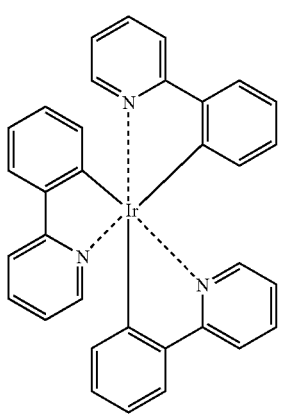

Ir-1

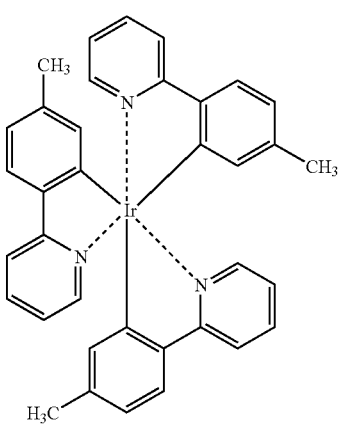

Ir-2

-continued
Ir-3
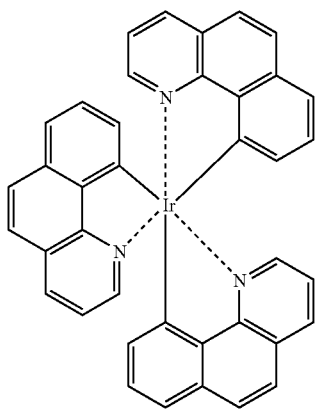
Ir-4
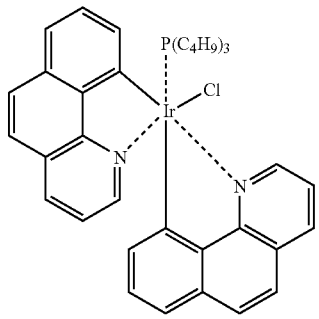
Ir-5
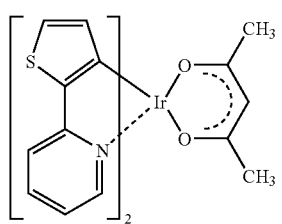
Ir-6
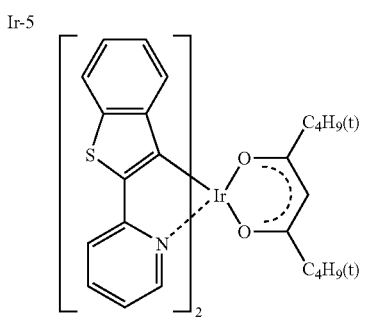
Ir-7
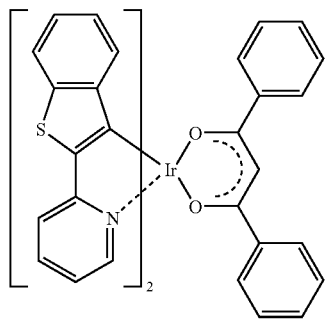
Ir-8
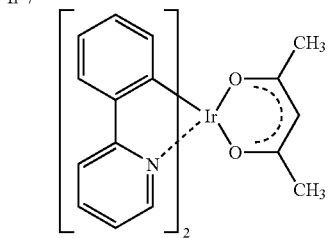
Ir-9
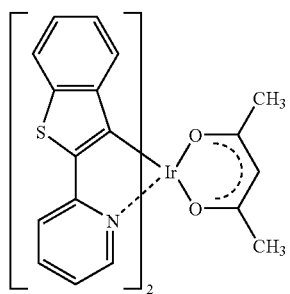
Ir-10
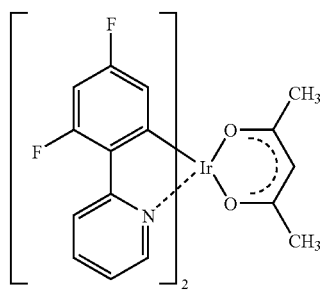
Ir-11
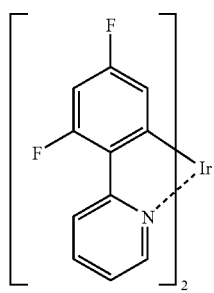
Ir-12
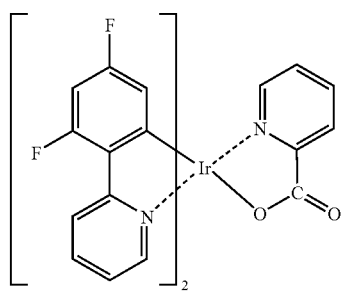

-continued
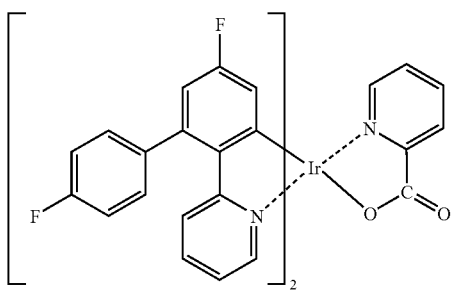
Ir-13
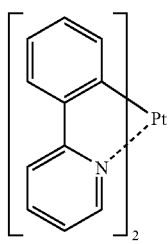
Pt-1
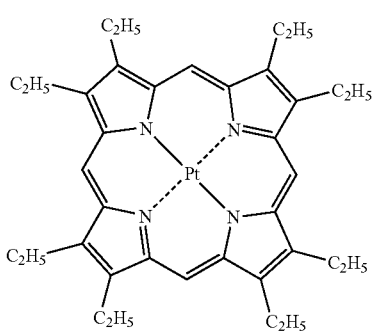
Pt-2
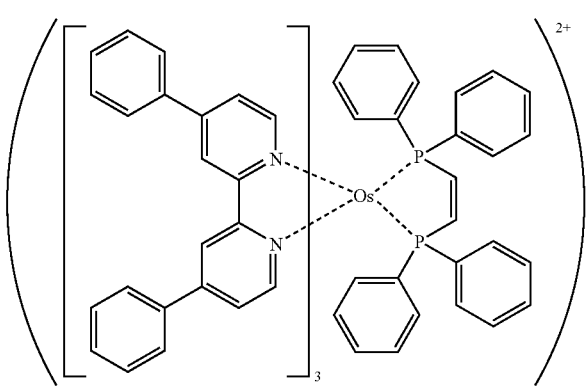
A-1
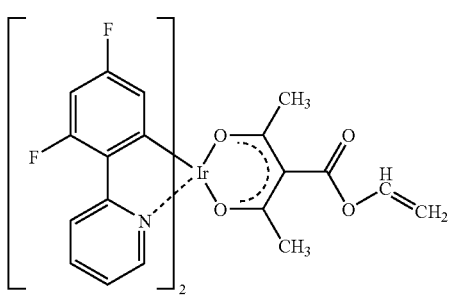
D-1
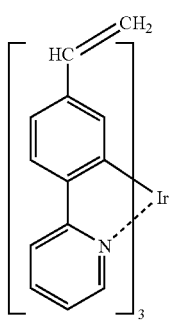
D-2
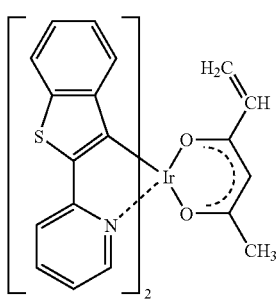
D-3
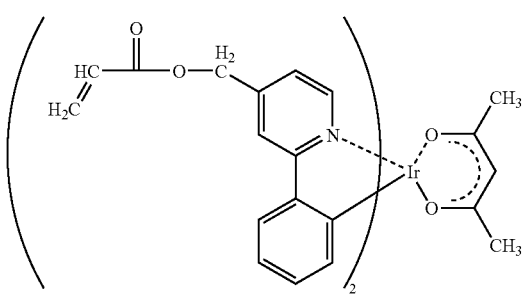
D-4

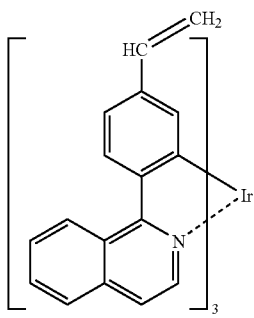

D-5

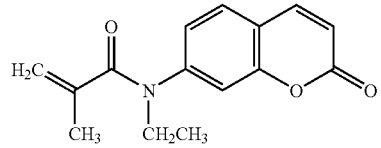

D-6

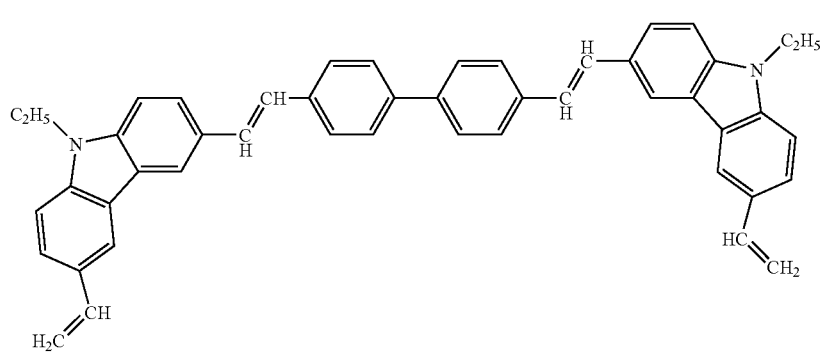

D-7

The phosphorescent compound to be used in the invention may be used together with another phosphorescent compound or fluorescent compound.

The fluorescent compound to be used in the invention is a compound capable of changing the maximum wavelength of emitting light by the presence thereof, and ones having high fluorescent quantum efficiency are preferable. The fluorescent quantum efficiency is preferably not less than 10% and particularly preferably not less than 30%. Concrete examples of the fluorescent compound include a coumarin type dye, a anthracene type dye, a pyrane type dye, a cyanine type dye, a chroconium type dye, a squalium type dye, an oxobenzanthracene dye, a fluorescein dye, a rhodamine type dye, a pyrylium type dye, a perylene type dye, a stilbene type dye, a polythiophne type dye and a rare-earth metal complex type fluorescent substance. The fluorescent quantum efficiency can be measured by the method described in "Course of Experimental Chemistry (Jikkenn Kagaku Koza) 7, 4$^{th}$ Edition, Spectroscopy II" p. 362, (1992) Maruzen Co., Ltd.

Concrete examples of the fluorescent substance relating to the invention are listed below, though the fluorescent substance is not limited to them.

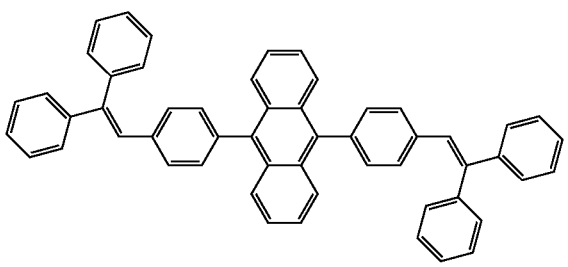

F1

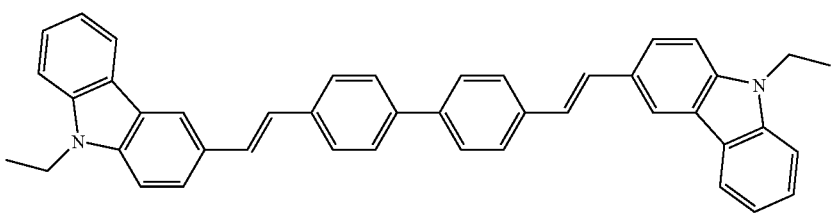

F2

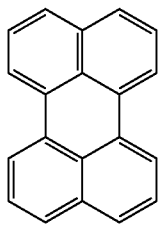
F3

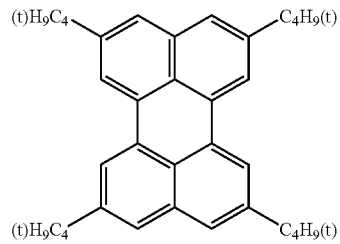
F4

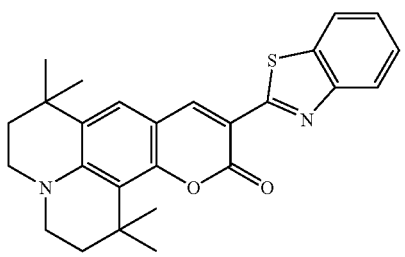
F5

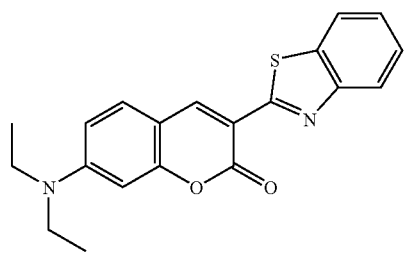
F6

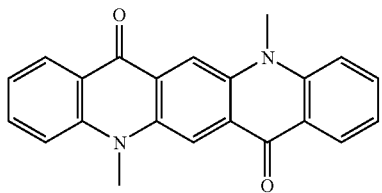
F7

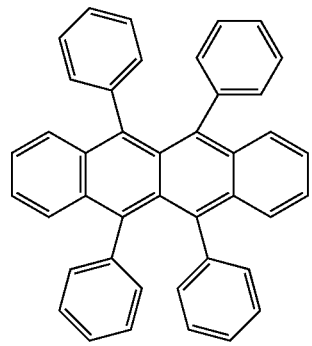
F8

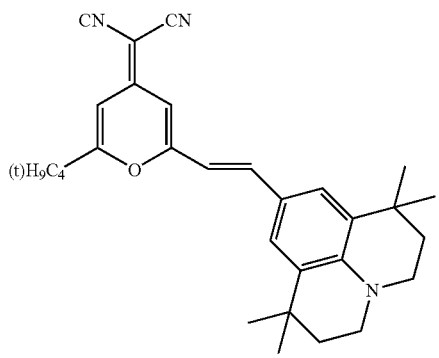
F9

<<Layer Constitution of the Organic EL Element>>

The layer constitution of the organic EL element of the invention is described below.

The organic EL element of the invention has electrodes (a cathode and an anode) and at least one or more organic layers on the substrate and at least one of the organic layers is a light emission layer containing the dopant.

The light emission layer relating to the invention is a layer capable of emitting light in the broad sense when applying electric current between the electrodes composed of the cathode and the anode, concretely a layer containing the compound capable of emitting light when electric current is applied between the electrodes composed of the cathode and the anode.

The organic layer relating to the invention may have a positive hole transfer layer, an electron transfer layer, an anode buffer layer and a cathode buffer layer according to necessity, which are provided between the cathode and the anode. Concretely, the following constitutions can be cited.

(i) Anode/Positive hole transfer layer/Light emission layer/Cathode layer (ii) Anode/Light emission layer/Electron transfer layer/Cathode layer (iii) Anode/Positive hole transfer layer/Light emission layer/Electron transfer layer/Cathode layer (iv) Anode/Anode buffer layer/Positive hole transfer layer/Light emission layer/Electron transfer layer/Cathode buffer layer/Cathode layer Number of the organic layers constituting the organic EL element among the layers placed between the cathode and the anode is preferably two or more and more preferably three or more.

<<Light Emission Layer>>

The light emission layer of the organic EL element of the invention contains the host compound and the phosphorescent compound (also referred to as the phosphorescence emission compound).

Moreover, plural kinds of the above host compound and known host compound may be used in combination. The transfer of charge can be controlled and the efficiency of the organic EL element can be raised by the use of plural kinds of the host compound. Besides, different lights can be mixed by the mixing use of plural kinds of phosphorescent compound so as that optional color of emitting light can be obtained. White light emission can be performed by controlling the kind and the doping amount of the phosphorescent compound, such the white light can be applied for lighting or backlight.

As such the known host compound, ones having positive hole transferring ability and electron transferring ability, preventing ability of shift of wavelength of emitting light to longer side and high glass transition temperature Tg are preferable. The host compound has one of ability of ejecting or transferring of positive hole and that of barrier to electron, and carbazole derivatives, azacarbazole derivatives, triazole derivatives, oxadiazole derivatives, imidazole derivatives, polyarylalkane derivatives, pyrazoline derivatives, pyrazole derivatives, phenylenediamine derivatives, arylamine derivatives, phenanthroline derivatives, oxazole derivatives, styrylanthracene derivatives, fluorenone derivatives, hydrazone derivatives, stilbene derivatives, organic metal compounds and arylmethane derivatives are cited as the examples of which.

Among them, the carbazole derivatives and azacarbazole derivatives are preferably used.

The thickness of thus prepared layer is preferably controlled within the range of from 5 nm to 5 μm though the layer thickness is not specifically limited.

<<Positive Hole Injection Layer, Positive Hole Transfer Layer, Electron Injection Layer and Electron Transfer Layer>>

Other layers constituting the organic EL element together with the light emission layer such as a positive hole injection layer, positive hole transfer layer, electron injection layer and electron transfer layer is described below.

The positive hole injection layer and the positive hole transfer layer have a function of transferring positive holes injected from the anode to the light emission layer. By the presence of the positive hole injection layer and the positive hole transfer layer between the anode and the light emission layer, many positive holes can be injected into the light emission layer by weaker electric field and the electron injected from the electrons injection layer or the electron transfer layer are accumulated at the interface in the light emission layer by the electron barrier being at the interface between the light emission layer and the positive hole injection layer of the positive hole transfer layer so that the light emission efficiency is raised. Thus the element superior in the light emission property can be obtained.

<<Positive Hole Injection Material and Positive Hole Transfer Material>>

The material of the positive hole injection layer and the positive hole transfer material, hereinafter referred to as positive hole injection material and positive hole transfer material is not specifically limited as long as the material has the ability of transferring the positive hole injected from the anode, and the material can be optionally selected and used from ones usually used as the positive hole injection or transfer material and known materials used for positive hole injection layer and the positive hole transfer layer.

The positive hole injection material and the positive hole transfer material has at least one of the positive hole injection ability, positive hole transfer ability and electron barrier ability and may be either an organic or inorganic substance. As the positive hole injection material and the positive hole transfer material, for example, triazole derivatives, oxadiazole derivatives, imidazole derivatives, polyarylalkane derivatives, pyrazoline derivatives, pyrazole derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, aniline type copolymers, electroconductive high molecular weight oligomer particularly thiophene oligomer are cited.

Porphyrin compounds, aromatic tertiary amine compounds and styrylamine compounds, particularly tertiary amine compounds, are preferably used though the foregoing compounds are usable as the positive hole injection material or the positive hole transfer material.

Typical examples of the aromatic tertiary amine compound and the styrylamine compound include N,N,N',N'-tetraphenyl-4,4'-diphenyl-diaminophenyl, N,N'-diphenyl-N,N'-bis(3-methylphenyl)-[1,1'-biphenyl]-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolulaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quadriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostylbenzene, N-phenylcarbazole, ones having two condensed aromatic rings in the molecular thereof described in U.S. Pat. No. 5,061,569 such as 4,4'-bis[N-(1-naphthyl)-N-phenylamino]biphenyl (α-NDP), and 4,4',4"-tris[N-(3-methylphenyl)-N-phenylamino]triphenylamine (MTDATA) described in Tokkai Hei 4-308688 in which three triphenylamine units are linked in a starburst form. Moreover, polymer materials formed by introducing the above material into a polymer chain or those in which the principal chain of polymer is formed by the above material are usable.

Besides, inorganic materials such as p-type Si and p-type SiC are also usable as the positive hole injection material or the positive hole transfer material. The positive hole injection layer and the positive hole transfer layer can be formed by making the positive hole injection material and the positive hole transfer material into thin layer by a known method such as vacuum vapor deposition method, a spin coating method, a casting method and an LB method.

(Thickness of Positive Hole Injection Layer and that of Positive Hole Transfer Layer)

The thickness of the positive hole injection layer or that of the positive hole transfer layer is preferably controlled within the range of approximately from 5 nm to 5 μm though the thickness of them is not specifically limited. The positive hole injection layer and the positive hole transfer layer may have a single layer structure comprising one or more kinds of the foregoing materials or a multilayered structure composed of plural layers which are the same or different in the composition thereof.

<<Electron Transfer Layer, Electron Transfer Material>>

The electron transfer layer relating to the invention has ability of transferring the electrons injected from the cathode, and the material of which can be used by optionally selecting one from compounds conventionally known as such the material.

Examples of the material used for the electron transfer layer, hereinafter referred to as electron transfer material, include nitro-substituted fluorenone derivatives, diphenylquinone derivatives, thiopyranedioxide derivatives, heterocyclic tetracarboxylic acid anhydride such as naphthaleneperylene, carbodimide, fluorenylidenemethane derivatives, derivatives of anthraqunonedimethane and anthrone, oxadiazole derivatives and organic metal complexes. Thiadiazole derivatives formed by replacing the oxygen atom in the oxadiazole derivatives by a sulfur atom and quinoxaline derivatives having a quinoxaline ring known as an electron-attractive group are also usable as the electron transfer material. Moreover, polymer materials formed by introducing the above material into a polymer chain or those in which the principal chain of polymer is formed by the above material are usable.

Metal complex of 8-quinolinol derivatives such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, bis(8-quinolinol)zinc (Znq) and complexes formed by replacing the central metal of the above metal complexes by In, Mg, Cu, Ca, Sn, Ga or Pb are also usable as the electron transfer material.

Other than the above, metal free- or metal-phthalocyanine and ones formed by substituted by an alkyl group or a sulfonic acid group at the terminal thereof are also preferably usable as the electron transfer material. Distylylpyrazine derivatives exemplified as the material of the light emission layer can be used for the electron transfer material and inorganic semiconductors such as n-type Si and n-type SiC are also usable as the electron transfer material similar to the case of the positive hole injection layer and the positive hole transfer layer.

(Thickness of Electron Transfer Layer)

The thickness of the electron transfer layer is preferably controlled within the range of approximately from 5 nm to 5 μm though the thickness of the layer is not specifically limited. The electron transfer layer may have a single layer structure comprising one or more kinds of the foregoing materials or a multilayered structure composed of plural layers which are the same or different in the composition thereof.

In the invention, a buffer layer (electrode interface layer) may be provided between the anode and the light emission layer or the positive hole injection layer or between the cathode and the light emission layer of the electron injection layer.

The buffer layer is a layer to be provided between the organic layer and the electrode for lowering the driving voltage or raising the light emission efficiency. The buffer layer is described in detail in "Organic EL Elements and Forefront of Industrialization Thereof", Vol. 2, Chapter 2, pp. 123-166, "Electrode materials", NTS Inc., (Nov. 30, 1998), and an anode buffer layer and a cathode buffer layer are used.

Details of the anode buffer layer are also described in Tokkai Hei 9-45479, 9-260062 and 8-288069, and a phthalocyanine buffer layer typified by copper phthalocyanine, an oxide buffer layer typified by vanadium oxide, an amorphous carbon buffer layer, and a polymer buffer layer using an electroconductive polymer such as polyaniline (emeraldine) and polythiophene are cited as concrete examples.

Details of the cathode buffer layer are also described in Tokkai Hei 6-325871, 9-17574 and 10-74586, and a metal buffer layer typified by strontium or aluminum, an alkali metal compound buffer layer typified by lithium fluoride, an alkali-earth metal compound buffer layer typified by magnesium fluoride, and an oxide buffer layer typified by lithium oxide are cited as concrete examples.

The buffer layer is desired to be an extremely thin layer and the thickness of the layer is preferably within the range of from 0.1 to 100 nm according to the material thereof.

A layer having another function may be provided additionally to the above basic structural layers according to necessity, for example, a functional layer such as a positive hole blocking layer described in Tokkai Hei 11-204258 and 11-204359 and "Organic EL Elements and Forefront of Industrialization Thereof", p. 237, "Electrode materials", NTS Inc., (Nov. 30, 1998), may be provided.

The organic layers relating to the invention are preferably formed by a coating method. For coating, a spin coat method, dip coat method, roller coat method, bar coat method, flexso printing method, screen printing method, offset coating method and ink-jet method are applicable and the inkjet method is preferable.

<<Electrode>>

The electrode of the organic EL element is described below. The electrodes of the organic EL element are composed of the anode and cathode. As the anode in the organic El element, metals having large working function (not less than 4 eV), alloys, electroconductive compounds and mixtures of them are preferably used. Concrete examples of such the electrode material include electroconductive transparent materials such as metal such as gold, CuI, indium tin oxide (ITO), $SnO_2$ and ZnO.

The anode may be prepared by forming a thin layer of such the electrode material by vapor deposition or sputtering and making the designated pattern by a photolithographic method, and the pattern may be formed by performing the vapor deposition or sputtering of the electrode material through a mask of designated pattern when the extreme precision is not necessary (about 100 μm or more). When light is taken out through the anode, the transparency of the anode is desirably not less than 10% and the sheet resistance of the anode is preferably not more than several hundreds Ω/□. The thickness is usually selected from 10 nm to 1 μm and preferably from 10 to 200 nm.

Besides, the cathode using electrode materials such as metals having small working function (not more than 4 eV), hereinafter referred to as electron injection metal), alloys, electroconductive compounds and mixtures thereof is preferably used. As the concrete examples of such the electrode material, sodium, sodium-potassium alloy, magnesium, lithium, magnesium/copper mixture, magnesium/silver mixture, magnesium/aluminum mixture, magnesium/indium mixture, aluminum/aluminum oxide ($Al_2O_3$) mixture, indium, lithium/aluminum mixture, and rare-earth metal are cited. Among them, a mixture of the electron injection metal and the secondary stable metal having large working function such as magnesium/silver mixture, magnesium/aluminum mixture, magnesium/indium mixture, aluminum/aluminum oxide ($Al_2O_3$) mixture and lithium/aluminum mixture are suitable from the viewpoint of the electron injection ability and the stability against oxidation.

The cathode can be prepared by forming a thin layer of the electrode material by vapor deposition or sputtering. The sheet resistance of the cathode is preferably not more than several hundreds Ω/□. The thickness is usually selected from 10 nm to 1 μm and preferably from 50 to 200 nm. It is suitable for raising the light emission efficiency that at least one of the anode and the cathode of the organic EL element is transparent or semi-transparent for permeating light.

<<Substrate>>

The organic EL element is produced on the substrate, hereinafter referred to as base plate, base, support and film.

The kind of the substrate usable as the organic EL element such as glass, plastics is not specifically limited as long as the material is transparent, though glass, quartz and transparent film can be cited as preferably usable substrates. Particularly preferable substrate is the transparent film which can give flexibility to the organic EL element.

Concretely, polyolefin resin (PO) such as homo- or co-polymers of ethylene, propylene and butane; amorphous polyolefin resin (APO) such as cyclic polyolefin; polyester type resin such as poly(ethylene terephthalate) (PET) and poly(ethylene-2,6-naphthalate) (PEN); polyamide type resin (PA) such as nylon 6, nylon 12, copolymerized nylon; poly(vinyl alcohol) (PVA) resin; Polyvinyl alcohol type resin such as ethylene-vinyl alcohol copolymer (EVOH); polyimide (PI) resin; polyetherimide (PEI) resin; polysulfone (PS) resin; polyethersulfone (PES) resin; polyetheretherketone (PEEK) resin; polycarbonate (PC) resin; poly(vinyl butylate) (PVB) resin; polyallylate (PAR) resin; fluororesin such as ethylene-tetrafluoroethylene copolymer (ETFE), polytrifluoroethylene chloride (PFA), tetrafluoroethylene-perfluoroalkylvinylether copolymer (FEP), polyvinylidene fluoride (PVDF), vinyl fluoride (PVF) and perfluoroethylene-perfluoropropylene-perfluorovinylether copolymer (EPA) are usable.

Other than the above resins, a resin composition composed of an acrylate compound having a radical reactive unsaturated compound, a resin composition composed of the acrylate compound and a mercapto compound having a thiol group, and a photo-curable resin such as a resin composition composed of an oligomer such as epoxyacrylate, urethaneacrylate, polyesteracrylate and poletheracrylate dissolved in a multi-functional acrylate monomer, and a mixture of them are also usable. Furthermore, a multi-layered film formed by the one or more kinds of such the resin by laminating or coating also can be used as the base film.

These materials may be used singly or in optionally mixed state. Materials available on the market such as Zeonex and Zeonor each manufactured by Nihon Zeon Corp., amorphous cyclopolyolefin film Arton manufactured by JSR Corp., polycarbonate film Pure-ace manufactured by Teijin Ltd., and cellulose triacetate film Konicatac KC4UX and KC8UX each manufactured by Konica Minolta Opto Inc., are preferably usable.

The substrate using the above described resins may be a non-stretched or stretched film.

The substrate relating to the invention can be manufactured by conventionally known methods. For example, the non-stretched substrate which is substantially amorphous without orientation can be produced by melting the resin in an extruder and extruding through a circular die or T die and rapidly cooling. The stretched substrate can be produced by stretching the non-stretched substrate in the flowing direction of the substrate (lengthwise axis) or the direction making a right angle with the flowing direction (widthwise axis) by a known method such as single axis stretching, successively bi-axial stretching tenter, simultaneously bi-axial stretching by tenter and tubular type simultaneously bi-axial stretching. In such the case, the stretching ratio can be optionally selected according to the raw material rein and the ratio in each of the lengthwise and widthwise direction is preferably from 2 to 10 times.

The substrate relating to the invention may be subjected to a surface treatment such as corona treatment, flame treatment, plasma treatment, glow discharge treatment, roughing treatment and chemical treatment before the formation of the vapor deposition layer.

On the substrate relating to the invention, an anchor coating agent layer may be formed for raising the adhesiveness with the vapor deposition layer. As the anchor coating agent to be used in the anchor coat agent layer, polyester resin, isocyanate resin, urethane resin, acryl resin, ethylene-vinyl alcohol resin, vinyl-modulated resin, epoxy resin, modulated silicone resin and alkyl titanate are usable singly or in combination of two or more kinds thereof. A known additive may be added to the anchor coating agent. The anchor coating can be carried out by coating the anchor coating agent by a known method such as roller coating, gravure coating, knife coating, dip coating and spray coating and removing the solvent or dilution agent by drying. A coating amount of the anchor coating agent of about from 0.1 to 5 g/m$^2$ (in dried state) is preferable.

The thickness of the substrate in the film state to be used in the invention is preferably from 10 to 200 μm and more preferably from 50 to 100 μm.

<<Displaying Device>>

The organic EL element of the invention may be used as a kind of lamp such as that to be used for lighting or exposing light source and a displaying device for directly viewing a still or moving image. When the element is used as the moving image display, the driving system may be either a single matrix (passive matrix) system of an active matrix system. A full color displaying device can be prepared by using two or more kinds of the organic EL element of the invention different from each other in the color of emitting light.

<<Technology for Taking Out Light>>

In the organic EL element of the invention, a treatment for giving prism like or lens like shape on the surface of the substrate for raising the taking out efficiency of light emitted from the light emission layer, it is also allowed to past a prism sheet or a lens sheet on the substrate sheet.

The organic EL element may have a low refractive layer between the electrode and the substrate. As the low refractive layer, a layer of aerogel, porous silica, magnesium fluoride and fluoro-polymer are cited.

The refractive index of the low refractive layer is preferably about 1.5 or less and more preferably not more than 1.35 since the refractive index of the substrate is generally about 1.5 to 1.7. The thickness of the low refractive medium is desirably 2 or more times of the wavelength in the medium because the effect of the low refractive index layer is reduced when the thickness of the low refractive medium nears the wavelength of the light so that the electromagnetic wave spread by evanescence enters into the substrate.

The organic EL element may have a diffraction grating between any layers or in a medium (in the transparent substrate or the transparent electrode). The grating to be introduced preferably has a two dimensional periodic refractivity. The light emitted from the light emission layer is radiated in random direction; therefore, the taking out efficiency of light is not improved so much by a conventional one dimensional diffraction grating having the periodic refractivity in a specific direction diffracts light advancing in a specific direction only. However, the light advancing in every direction is diffracted when the refractive index has two dimensional distribution so that the taking out efficiency of light is raised. The position for providing the diffractive grating is preferably near the organic light emission layer from where the light is emitted though the grating may be provided between any layers or in the medium (in the transparent substrate or in the transparent electrode) as above mentioned. In such the case, the period of the diffractive grating is preferably about ½ to 3 times of the wavelength of the light in the medium. Arrangement of the diffractive grating is preferably two dimensionally repeating shape such as lattice shape, triangular lattice shape and honeycomb shape.

<<Gas Barrier Layer>>

The substrate relating to the invention preferably has a gas barrier layer. The dark spot occurrence and aging stability under high temperature and high humidity are further improved by the gas barrier layer.

The composition of the gas barrier layer relating to the invention is not specifically limited as long as the layer blocks permeation of oxygen and water vapor. The oxygen permeability is preferably not more than 0.005 ml/m²/day at 23° C. and 0% RH and the water vapor permeability measured according to the method of JIS K7129 B is preferably 0.1 g/m²/day. As the material for constituting the gas barrier layer relating to the invention, silicon oxide, aluminum oxide, silicon oxide nitride, aluminum oxide nitride, magnesium oxide, zinc oxide, indium oxide and tin oxide can be cited.

In the invention, the optimum condition of thickness of the gas barrier layer is varied depending on the kind of the material and the constitution and suitably selected though a thickness within the range of from 5 to 2,000 nm is preferable. When the thickness of the gas barrier layer is thinner that the above range, a uniform layer cannot be obtained and the barring ability to gas is difficultly obtained. When the thickness of the gas barrier layer is thicker than the above range, flexibility is difficultly given to the film having the gas barrier so that possibility of occurrence of clacking of the film is caused by exterior cause such as bending and stretching after the production of the film.

The gas barrier layer relating to the invention can be formed by applying a spraying method, spin coating method, sputtering method, ion assisting method, later-mentioned plasma CVD method or a later-mentioned plasma CVD under atmospheric or near atmospheric pressure.

FIG. 1 shows an example of the constitution of the substrate having the gas barrier layer relating to the invention.

The constitution and the density of the gas barrier layer relating to the invention are described below.

The gas barrier layer 21 is composed of layers each different in the density thereof laminated on the substrate 22, and a unit is composed of a lamination of a contacting layer 23, a ceramic layer 24, a protection layer 25 and a ceramic layer 24 and two of the units are laminated in the example shown in FIG. 1. The density in each of the layers is respectively uniform and the density of the ceramic layer is made higher than that of each of the contacting layer and the protection layer. Each of the layers may be constituted by two or more lays though the layers shown in FIG. 1 each has single layer structure.

As the method for forming the contacting layer, ceramic layer and protection layer on the substrate, a spraying method, spin coating method, sputtering method, ion assist method, later-mentioned plasma CVD method and a later-mentioned plasma CVD under atmospheric or near atmospheric pressure are applicable.

EXAMPLES

The Invention is described below referring examples but the invention is not limited to the examples.

Example 1

(Preparation of Organic EL Element 1-1)

Substrate 1 was prepared by forming a gas barrier layer having the constitution profile shown in FIG. 1 by the later-mentioned atmospheric pressure plasma discharging apparatus and discharging conditions on polyethylene naphthalate film of 100 μm, manufactured by Teijin-DuPont Films Ltd., hereinafter referred to as PEN.

(Atmospheric Pressure Plasma Discharging Treatment Apparatus)

Figure 2:
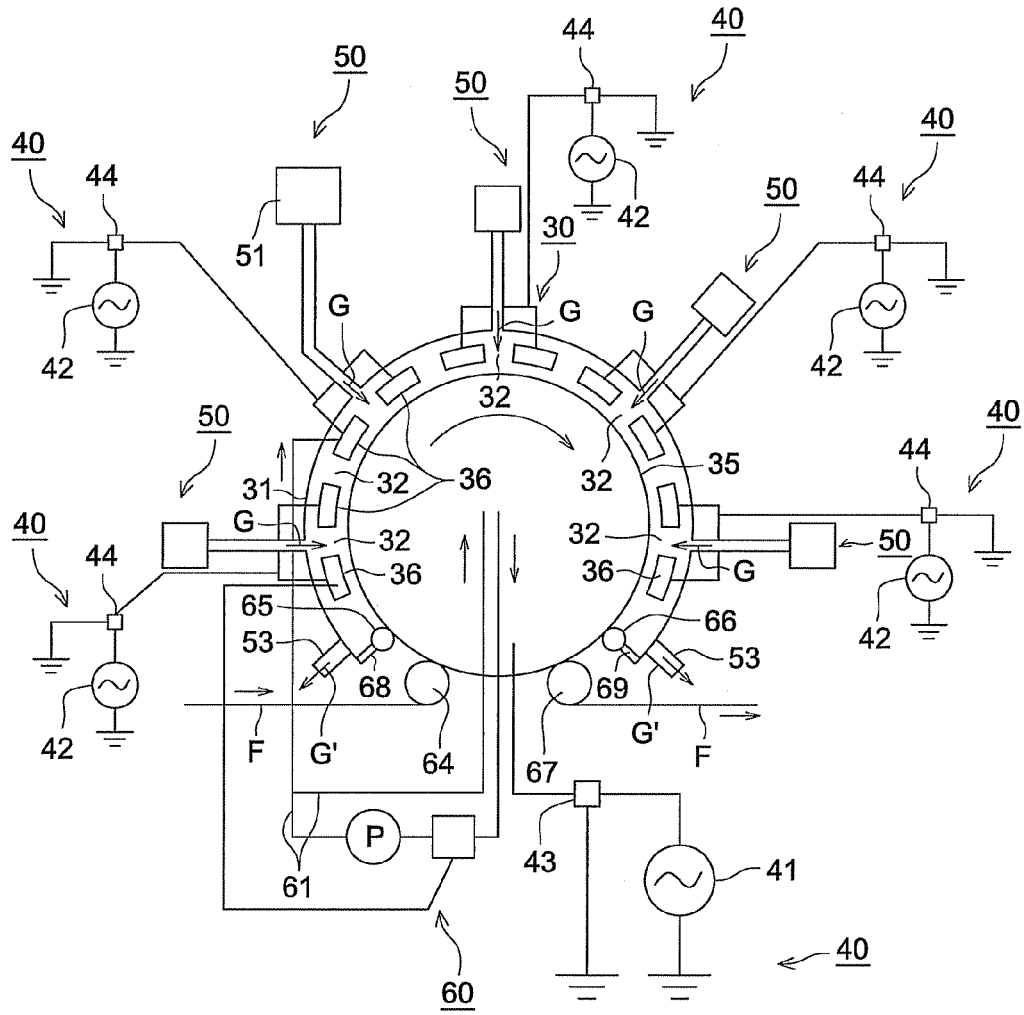
FIG. 2 shows an outline of an example of atmosphere pressure plasma discharging apparatus for treating the substrate between facing electrodes which is effectively applied for the invention.

In the atmospheric pressure plasma discharge treatment apparatus shown in FIG. 2, a set of a roller electrode covered with dielectrics and plural square tube-shaped electrodes was installed.

The roller electrode as the first electrode was prepared by that a metal jacket roller made from titanium alloy T64 having a cooling means by water was covered by sputtering a high density and highly contactable alumina layer so as to made the diameter of the roller was come up to 1,000 mm. The square tube-shaped electrodes as the second electrodes were each prepared by that a hollow square tube-shaped titanium alloy T64 was covered by the dielectrics of 1 mm by the same method as above and applied for composing the square tube-shaped fixed electrodes.

Ten square tube-shaped electrodes were arranged around the rotating roller electrode so that the space between the facing electrodes was set at 1 mm. The total discharging area of the square tube-shaped fixed electrodes was 150 cm (the widthwise length)×4 cm (the length in the conveying direction)×10 (number of the electrodes)=6,000 cm². Suitable filters were provided for each electrode.

During the plasma discharge, the temperature of the first electrode (rotating roller electrode) and the second electrodes (square tube-shaped electrodes) were each kept at 120° C. and 80° C., respectively, and the roller rotating electrode was rotated by driving for forming the thin layer. Among the ten square tube-shaped electrodes, two electrodes arranged at the upper stream were used for forming the first layer (contacting layer), next six electrodes were used for forming the second layer (ceramic layer) and the next two electrodes were used for forming the third layer (protection layer), and the conditions of each of the electrodes were set as follows so that the layers were formed by once passing.

(First Layer: Contacting Layer)

Plasma discharge was carried out under the following conditions for forming a contacting layer of about 50 nm.

<Condition of Gases>

| | |
|---|---|
| Discharging gas: Nitrogen gas | 94.5% by volume |
| Thin layer forming gas: Hexamethyldisiloxane (vaporized by mixing with nitrogen gas by a vaporizing apparatus manufactured by Lintec Corp.) | 0.5% by volume |
| Additive gas: Oxygen gas | 5.0% by volume |

<Electric Power Source Condition: Power Source of the First Electrode was Only Used>

Kind of the power source of the first electrode side: High frequency electric source manufactured by Oyo Electric Co., Ltd.

| Frequency | 80 kHz |
|---|---|
| Output density | 10 W/cm² |

The density of thus formed first layer (contacting layer) measured by the X-ray reflectivity method using the foregoing MXP 21, manufactured by MAC Science Co., Ltd., was 1.90.

(Second Layer: Ceramic Layer)

Plasma discharge was carried out under the following conditions for forming a ceramic layer of 30 nm.

<Condition of Gases>

| Discharging gas: Nitrogen gas | 94.9% by volume |
|---|---|
| Thin layer forming gas: Hexamethyldisiloxane (vaporized by mixing with nitrogen gas by a vaporizing apparatus manufactured by Lintec Corp.) | 0.1% by volume |
| Additive gas: Oxygen gas | 5.0% by volume |

<Electric Power Source Condition>

Kind of the power source of the first electrode side: High frequency electric source manufactured by Oyo Electric Co., Ltd.

| Frequency | 80 kHz |
|---|---|
| Output density | 10 W/cm² |

Kind of the power source of the second electrode side: High frequency electric source manufactured by Pearl Kogyo Co., Ltd.

| Frequency | 13.56 kHz |
|---|---|
| Output density | 10 W/cm² |

The density of thus formed second layer (ceramic layer) measured by the X-ray reflectivity method using the foregoing MXP 21, manufactured by Mac Science Co., Ltd., was 2.20 g/cm³.

(Third Layer: Protection Layer)

Plasma discharge was carried out under the following conditions for forming a protection layer of about 200 nm.

<Condition of Gases>

| Discharging gas: Nitrogen gas | 93.0% by volume |
|---|---|
| Thin layer forming gas: Hexamethyldisiloxane (vaporized by mixing with nitrogen gas by a vaporizing apparatus manufactured by Lintec Corp.) | 2.0% by volume |
| Additive gas: Oxygen gas | 5.0% by volume |

<Electric Power Source Condition: Power Source of the First Electrode was Only Used>

Kind of the power source of the first electrode side: High frequency electric source manufactured by Oyo Electric Co., Ltd.

| Frequency | 80 kHz |
|---|---|
| Output density | 10 W/cm² |

The density of thus formed first layer (contacting layer) measured by the X-ray reflectivity method using the foregoing MXP 21, manufactured by Mac Science Co., Ltd., was 1.95 g/cm³.

The water vapor permeability measured according to JIS-K-7129B was not more than $10^{-3}$ g/m²/day. The oxygen permeability measured according to JIS-K-7126B was not more than $10^{-3}$ g/m²/day.

Then a pattern was made on a 120 nm layer of ITO (indium oxide) formed on the substrate and the substrate with the transparent ITO electrode was washed by isopropyl alcohol by applying ultra sonic waves, dried by dried nitrogen gas and then cleared by UV-ozone washing for 5 minutes. The substrate was fixed on a substrate holder of a vacuum vapor deposition apparatus available on the market and the pressure was reduced by a vacuum degree of $4\times10^{-4}$ Pa to prepare an ITO substrate 100.

Figure 3:
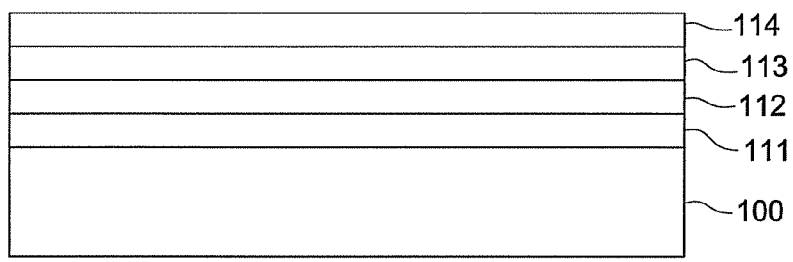
FIG. 3 shows an ejection and layer forming processes of the organic EL element 1-1.

A fluid D1 containing a polymer of the following exemplified compound A15 as the host, phosphorescent compound Ir-1 (weight ratio of 100:5) and THF was ejected onto the ITO substrate 100 using an inkjet head 10 available on the market (KM512S, non-aqueous type head manufactured by Konica Minolta Inc.) to form a light emission layer 111 having a thickness of 50 nm under conditions of 100° C. and 60 minutes as shown in FIG. 3.

After that, Fluid D2 containing a polymer of the later-exemplified compound A28 and THF was ejected onto the light emission layer 111 through the inkjet head 10 to form a electron transfer layer 112 having a thickness of 50 nm under condition of 100° C. and 60 minutes. Then an aluminum layer 113 (cathode) having a thickness of 200 nm was formed by vapor deposition on the electron transfer layer 112.

Moreover, the content of the organic solvent in the light emission layer 111 and the electron transfer layer 112 was controlled so as to become to the value described in Table 1. Furthermore, the substrate 1 was pasted on the above-mentioned to prepare Organic EL Element 1-1.

<Synthesis of the Polymer of Exemplified Compound A15>

In a reaction vessel, 1.34 g (2.5 mmole) of Exemplified Compound A-15, 0.010 g (0.061 mmole) of 2,2'-azobis (isobutylonirile) (BIAN) and 30 ml of butyl acetate were charged and made react for 10 hours at 80° C. after exchanging air in the vessel by nitrogen gas. After the reaction, the polymer was re-precipitated by adding acetone and recovered by filtration. A chloroform solution of the recovered polymer was poured into methanol for purifying by re-precipitation; such the purification was repeated twice and then the precipitate was dried in vacuum. Thus 1.20 g of powder of the objective polymer of Exemplified Compound A15 was obtained. The weight average molecular weight of the copolymer measured by GPC using hexafluoroisopropanol (HFIP) as the separation liquid was 10,000 in terms of polystyrene.

A polymer of Exemplified Compound A28 was synthesized in the same manner as the above. (Weight average molecular weight was 26,000.)

(Preparation of Organic EL Elements 1-2 to 1-9)

Organic EL Elements 1-2 to 1-9 were prepared in the same manner as in Organic EL Element 1-1 except that the material of each of the layers were changed those described in Table 1.

(Preparation of Organic EL Element 1-10)

On a glass substrate having an indium tin oxide transparent electrode (ITO electrode), a layer having a thickness of 50 nm of A31 and phosphorescent compound Ir-1 (weight ratio 100:5) was deposited in vacuum as a light emission layer and then a electron transfer layer with a thickness of 50 nm of M1 was deposited in vacuum. After that, a layer of aluminum having a thickness of 200 nm was deposited in vacuum to form a cathode. Furthermore, a substrate 1 was pasted for preparing Organic EL Element 1-10.

(Preparation of Organic EL Element 1-11)

Organic EL Element 1-11 was prepared in the same manner as in Organic EL Element 1-1 except that the material of each of the layers were changed to those described in Table 1 and the substrate was replaced by a glass plate having an indium tin oxide transparent electrode (ITO electrode).

(Organic EL Elements 1-12 and 1-13)

Organic EL Elements 1-12 and 1-13 were prepared in the same manner as in Organic EL Element 1-1 except that the materials of each of the layers were replaced by those described in Table 1.

(Preparation of Organic EL Element 1-14)

Organic EL Element 1-14 was prepared in the same manner as in Organic EL Element 1-1 except that THF was changed by xylene and the materials of each of the layers were replaced by those described in Table 1.

(Preparation of Organic EL Element 1-15)

Organic EL Element 1-15 was prepared in the same manner as in Organic EL Element 1-1 except that the substrate 1 to be pasted on the aluminum 113 (cathode) is replaced by PEN having a thickness of 100 μm.

M1

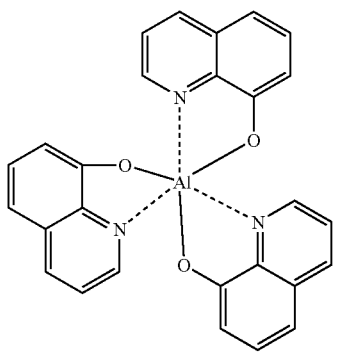

M2

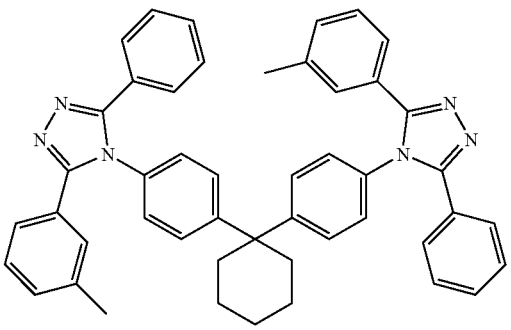

M3

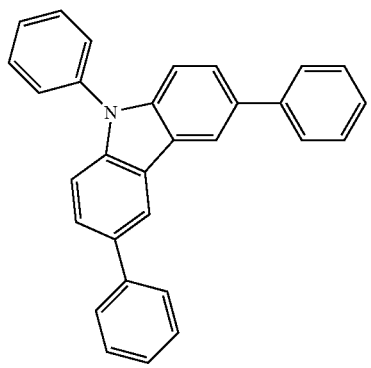

The density and organic solvent content of the light emission layer of each of Organic EL Elements 1-1 to 1-11 were measured by the foregoing methods. The measured results are listed in Table 1.

TABLE 1

| | Light emission layer (50 nm) | | | Electron transfer layer (50 nm) | Layer density (Light emission layer) Ag/cm$^3$ | Organic solvent content of organic layer | Remarks |
|---|---|---|---|---|---|---|---|
| | Host | Band gap (eV) | Molecular weight | Dopant (5% by weight) | | | |
| OLED1-1 | A15 | 3.50 | 10000 | Ir-1 | A28 | 1.11 | 15 ppm | Inventive |
| OLED1-2 | A31 | 3.43 | 484.6 | Ir-1 | A35 | 1.20 | 11 ppm | Inventive |
| OLED1-3 | A43 | 3.50 | 512.6 | Ir-1 | A32 | 1.24 | 11 ppm | Inventive |
| OLED1-4 | A34 | 3.70 | 1180 | Ir-1 | A11 | 1.22 | 15 ppm | Inventive |
| OLED1-5 | M1 | 2.70 | 474.5 | Ir-1 | A35 | 1.20 | 110 ppm | Inventive |
| OLED1-6 | M2 | 3.91 | 702.9 | Ir-1 | A33 | 1.21 | 14 ppm | Inventive |
| OLED1-7 | A41 | 3.53 | 408.5 | Ir-1 | A32 | 1.23 | 12 ppm | Inventive |
| OLED1-8 | A46 | 3.50 | 498.6 | Ir-1 | A32 | 1.22 | 13 ppm | Inventive |
| OLED1-9 | A47 | 3.51 | 498.6 | Ir-1 | A32 | 1.24 | 12 ppm | Inventive |
| OLED1-10 | M1 | 2.70 | 474.5 | Ir-1 | A33 | 1.30 | 2000 ppm | Comparative |
| OLED1-11 | M2 | 3.91 | 702.9 | Ir-1 | A35 | 1.21 | 15 ppm | Inventive |
| OLED1-12 | M3 | 3.42 | 395 | Ir-1 | A35 | 1.22 | 30 ppm | Inventive |
| OLED1-13 | A13 | 3.43 | 1100000 | Ir-1 | A35 | 1.12 | 150 ppm | Inventive |
| OLED1-14 | A13 | 3.43 | 30000 | Ir-1 | A28 | 1.07 | 500 ppm | Comparative |
| OLED1-15 | A31 | 3.43 | 484.6 | Ir-1 | A35 | 1.20 | 30 ppm | Inventive |

(Evaluation of Organic EL Element)

Thus obtained organic EL elements were evaluated as follows. The results of evaluation are listed in table 2.

<Emitted Light Luminance>

The luminescence (cd/m$^2$) of the emitted light when a DC voltage of 10 V was applied at 23° C. to the organic EL element was measured. The emitted light luminance was expressed by a relative value when that of Organic EL Element 1-11 was set at 100. The emitted light luminance was measured by CS-1000 manufactured by Konica Minolta Sensing Inc.

<Voltage Rising Ratio>

The element was driven by applying constant electric current of 10 mA/cm$^2$ and voltage was measured at the initial time and that at after 150 hours when. A relative value of the voltage after 150 hours to the initial voltage was defined as the voltage rising ratio.

<Aging Stability>

The emitted light luminance (cd/m$^2$) was measured after aging the organic EL element for one month at 60° C. and 70% RH. The aging stability was expressed by a relative value to the emitted light luminance of before aging.

<Dark Spot>

The organic EL element was driven by applying constant electric current of 15 mA/cm$^2$ for 30 hours and then the number of not-lighting point (dark spot) was visually counted.

TABLE 2

| Organic EL element | Emitted light luminance | Voltage rising ratio | Aging stability | Dark spot number | Remarks |
| --- | --- | --- | --- | --- | --- |
| OLED1-1 | 118 | 111 | 95 | 12 | Inventive |
| OLED1-2 | 110 | 113 | 93 | 14 | Inventive |
| OLED1-3 | 117 | 113 | 93 | 13 | Inventive |
| OLED1-4 | 107 | 116 | 92 | 16 | Inventive |
| OLED1-5 | 101 | 122 | 85 | 24 | Inventive |
| OLED1-6 | 101 | 121 | 87 | 23 | Inventive |
| OLED1-7 | 116 | 113 | 93 | 14 | Inventive |
| OLED1-8 | 116 | 113 | 93 | 14 | Inventive |
| OLED1-9 | 117 | 113 | 93 | 13 | Inventive |
| OLED1-10 | 97 | 130 | 80 | 40 | Comparative |
| OLED1-11 | 100 | 125 | 83 | 26 | Inventive |
| OLED1-12 | 109 | 114 | 91 | 15 | Inventive |
| OLED1-13 | 109 | 115 | 90 | 17 | Inventive |
| OLED1-14 | 98 | 127 | 81 | 33 | Comparative |
| OLED1-15 | 108 | 122 | 88 | 25 | Inventive |

As is cleared in Table 2, the elements having the layer density within the range of the invention are lowered in the number of dark spot and voltage rising ratio and raised in the aging stability. Moreover, it is observed that the above propertied are enhanced and the emitted light luminance is also increased as to the element having the band gap within the range of the invention.

Example 2

(Preparation of Organic EL Element 2-1)

A fluid containing Exemplified compound A36 and THF was ejected by the inkjet head 10 available on the market onto an ITO substrate 100 and a positive hole transfer layer having a thickness of 50 nm was formed under a condition of 100° C. at 60 minutes.

Then a fluid containing Exemplified compound A31, a phosphorescent compound Ir-12 (weight ratio 100:4) and THF was ejected onto the electron transfer layer and a light emission layer having a thickness of 50 nm was formed under a condition of 100° C. at 60 minutes.

After that, a fluid containing Exemplified compound A35, and THF was ejected onto the light emission layer to form an electron transfer layer having a thickness of 50 nm. Then a aluminum layer 113 (cathode) having a thickness of 200 nm was deposited in vacuum on the electron transfer layer.

Moreover, the content of organic solvent in the organic layer was controlled so as to be that described in Table 3. On thus prepared product, a substrate 1 was pasted to prepare Organic EL Element 2-1.

Organic EL Elements 2-2 to 2-6 were prepared in the same manner as in Organic EL Element 2-1 except that the materials of each of the layers were replaced by those described in Table 3 and the drying condition was controlled so that the content of remaining organic solvent was made to those described in Table 3. Organic EL Elements 2-7 and 2-8 were prepared in the same manner as in Organic EL Element 1-10 of Example 2 except that the materials of each of the layers were replaced by those described in Table 3 and the drying condition was controlled so that the content of remaining organic solvent was made to that described in Table 3. Moreover, Organic EL Element29 was prepared in the same manner as in Organic EL Element 2-1 of Example 1 except that the materials of each of the layers were replaced by those described in Table 3 and the drying condition was controlled so that the content of remaining organic solvent was made to that described in Table 3.

TABLE 3

| | Positive hole transfer layer (50 nm) | Light emission layer (50 nm) | | | Electron transfer layer (50 nm) | Layer density (Light emission layer) g/cm$^3$ | Organic solvent content of organic layer | Remarks |
| --- | --- | --- | --- | --- | --- | --- | --- | --- |
| | | Host | Band gap (eV) Molecular weight | | Dopant (4% by weight) | | | |
| OLED2-1 | A36 | A31 | 3.43 | 484.6 | Ir-12 | A35 | 1.22 | 5000 ppm | Inventive |
| OLED2-2 | A36 | A31 | 3.43 | 484.6 | Ir-12 | A35 | 1.22 | 110 ppm | Inventive |
| OLED2-3 | A36 | A31 | 3.43 | 484.6 | Ir-12 | A35 | 1.21 | 15 ppm | Inventive |
| OLED2-4 | A37 | A43 | 3.50 | 512.6 | Ir-12 | A32 | 1.24 | 12 ppm | Inventive |
| OLED2-5 | A7 | A15 | 3.50 | 10000 | D-1 | A27 | 1.14 | 8 ppm | Inventive |
| OLED2-6 | A36 | A31 | 3.43 | 484.6 | F1 | A35 | 1.22 | 10 ppm | Inventive |
| OLED2-7 | A37 | M2 | 3.91 | 702.9 | Ir-12 | A35 | 1.31 | 15 ppm | Comparative |
| OLED2-8 | A36 | M1 | 2.70 | 474.5 | Ir-12 | A35 | 1.30 | 0.001 ppm | Comparative |
| OLED2-9 | A7 | A13 | 3.43 | 10000 | Ir-12 | A27 | 1.08 | 110 ppm | Comparative |

(Evaluation of Organic EL Element)

The above prepared organic EL element was subjected to evaluation by the measuring method and evaluation method the same as in Example 1. The results are listed in Table 4. The emitted light luminance was expressed by relative value when the luminance of Organic EL Element 2-7 was set at 100.

TABLE 4

| Organic EL element | Emitted light luminance | Voltage rising ratio | Aging stability | Number of dark spot | Remarks |
|---|---|---|---|---|---|
| OLED2-1 | 102 | 125 | 86 | 25 | Inventive |
| OLED2-2 | 106 | 119 | 90 | 20 | Inventive |
| OLED2-3 | 110 | 114 | 92 | 13 | Inventive |
| OLED2-4 | 117 | 112 | 94 | 12 | Inventive |
| OLED2-5 | 118 | 112 | 95 | 11 | Inventive |
| OLED2-6 | 105 | 122 | 89 | 19 | Inventive |
| OLED2-7 | 100 | 124 | 86 | 27 | Comparative |
| OLED2-8 | 98 | 130 | 80 | 39 | Comparative |
| OLED2-9 | 102 | 126 | 85 | 30 | Comparative |

As is cleared in Table 4, the organic EL elements of the invention are superior in the luminance of emitted light and reduced in the voltage rising and the dark spot number and high in the aging stability under high temperature and high humidity condition. Such the improvement effects are considerable when the phosphorescent compound is combined.

Example 3

Figure 4:
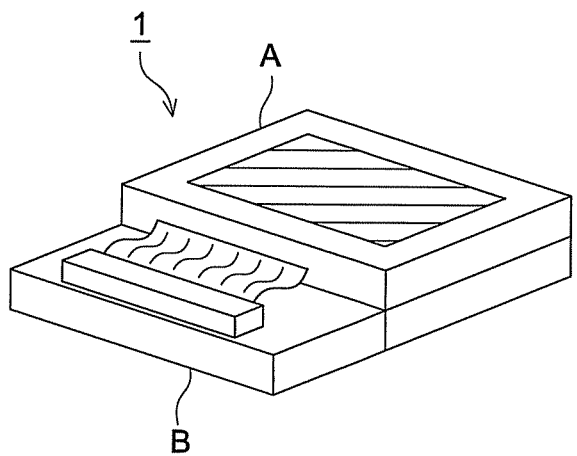
FIG. 4 shows an active matrix type full color displaying device.
Figure 5:
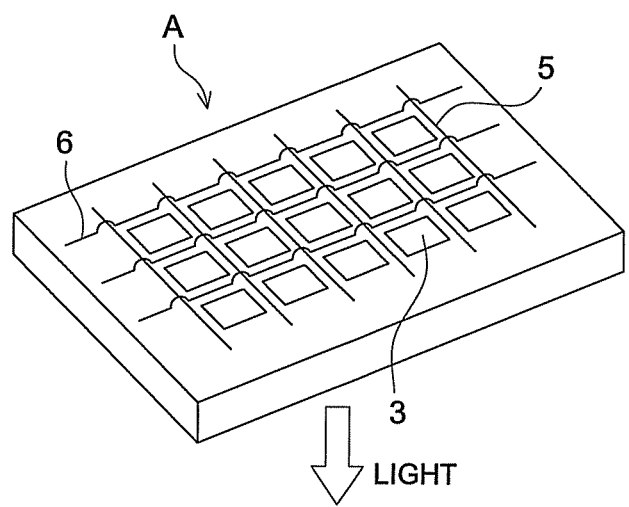
FIG. 5 shows a displaying portion A of a full color displaying apparatus.

Organic EL Element 2-4, a green light emission organic EL element and a red light emission organic EL element each prepared in the same manner as in Organic EL Element 2-4 except that the phosphorescent compound was replace by Ir-1 and Ir-9, respectively, were arranged on the same substrate to prepare an active matrix type full color displaying device shown in FIG. 4. In FIG. 5, a schematic drawing of the displaying device is only displayed. The display portion A had wirings containing a scanning line 5, and a data line 6 and plural picture elements 3 (picture elements of red range, picture elements of green light range and picture elements of blue range. The scanning line 5 and plural data lines 6 were composed of an electroconductive material and the scanning line and the data line were crossing at a right angle in lattice shape and connected to the picture element 3 at the crossing point (the detail is not drawn). The plural picture elements were each driven by active matrix system having the organic EL element corresponding to each color of emitting light, a switching transistor as an active element and a driving transistor. When a scanning signal was applied from the scanning line 5, the organic EL element received image data from the data line 6 and emits light according to the received image data. Thus full color displaying could be performed by suitably arranging the red, green and blue image elements.

Clear full color moving image can be displayed by driving the full color displaying device.

Example 4

<<Preparation of Lighting Device>>

A glass case having a reflective coating was provided on non-light emitting side of each of the blue, green and red light emission organic EL elements prepared in Example 3 to prepare a lighting device.

Examples 5

(Preparation of Organic EL Element 5-1)

Organic EL Element 5-1 having the constitution of elements and layer thickness given in the following Table 5 was prepared in the same manner as in Organic EL Element in Example 1.

TABLE 5

| Organic EL element No. | Organic layer | Material | Layer thickness (μm) |
|---|---|---|---|
| 5-1 | Positive hole injection layer | A39 | 40 |
|  | Positive hole transfer layer | A36 | 10 |
|  | Light emission layer 1 | A43 (97%) band gap: 3.50 ev Ir-12 (3%) | 15 |
|  | Intermediate layer 1 | A40 | 5 |
|  | Light emission layer 2 | A43 (92%) band gap: 3.50 ev Ir-9 (8%) | 10 |
|  | Intermediate layer 2 | A43 | 5 |
|  | Light emission layer 3 | A43 (95%) band gap: 3.50 ev Ir-1 (5%) | 5 |
|  | Positive hole blocking layer | A33 | 10 |
|  | Electron transfer layer | A35 | 50 |

The layer densities of the light emission layer 1, 2 and 3 were each 1.22, 1.21 and 1.22 g/cm$^3$, respectively. The drying condition was controlled so that the organic solvent content in the organic layer became 15 ppm.

An aluminum layer having a thickness of 200 nm was deposited in vacuum onto the above product. The substrate 1 was pasted the same as in Organic EL Element 1-1 on the occasion of sealing.

A glass case having a reflective coating was provided onto the non-light emission side of thus obtained Organic EL Element 5-1 the same as in Example 4 to prepare a lighting device. The lighting device had high light emitting efficiency and could be used as a thin type lighting device emitting white light for ling life time.

Moreover, the reproducible colors range of the lighting device when combined with a color filter available on the market for display was evaluated. It was confirmed that the combination of Organic EL Element 5-1 and the color filter showed wide color reproducible range and had superior in the color reproducibility.

The invention claimed is:

1. An organic electroluminescent element having an anode, a cathode, and one or more organic layers between the anode and the cathode provided on a substrate, wherein the one or more organic layers contain a light emission layer, and the density of the light emission layer is from 1.10 to 1.25 g/cm$^3$; and the light emission layer contains a dopant and a host compound having a band gap of from 2.5 to 3.8 eV, the host compound being represented by one selected from the group consisting of Formulas (1), (4) and (5):

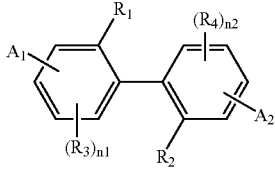

Formula (1)

wherein $R_1$ to $R_4$ are each a substituent; n1 and n2 are each an integer of from 0 to 3;
$A_1$ and $A_2$ each are a group represented by Formula (2).

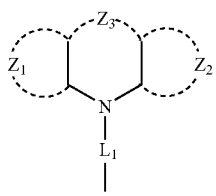

Formula (2)

wherein $Z_1$ and $Z_2$ each form an aromatic heterocyclic ring or an aromatic hydrocarbon ring each of which may have a substituent; and $Z_3$ is a di-valent linking group or a single bond;
and $L_1$ is a di-valent linking or a single bond,

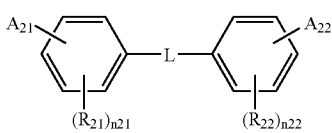

Formula (4)

wherein $R_{21}$ and $R_{22}$ are each a substituent; n21 and n22 are each an integer of 0 to 3;
$A_{21}$ and $A_{22}$ each are a group represented by Formula (2); and L is a di-valent linking group,

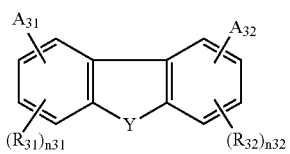

Formula (5)

wherein $A_{31}$ and $A_{32}$ each are a substituent; n31 and n 32 each are an integer of 0 to 3; Y is an oxygen atom, a sulfur atom, an imino group, a sulfoxide group or a sulfonyl group; and $R_{31}$ and $R_{32}$ each are a group represented by Formula (2).

2. The organic electroluminescent element described in claim 1, having a light emission layer which contains a dopant and a host compound, wherein the dopant is a phosphorescent compound and the host compound has a band gap of 2.9 to 3.8 eV.

3. The organic electroluminescent element described in claim 1, wherein the host compound has a band gap of 3.45 to 3.65 eV.

4. The organic electroluminescent element described in claim 1, wherein the at least one of the one or more organic layers which have a density of 1.10 to 1.25 g/cm$^3$ has a density of 1.20 to 1.25 g/cm$^3$.

5. The organic electroluminescent element described in claim 4, wherein the at least one of the one or more organic layers which have a density of 1.20 to 1.25 g/cm$^3$ is a light emission layer which contains a dopant and a host compound having a band gap of 2.5 to 3.8 eV, and wherein the host compound has a molecular weight of 400 to 2,000.

6. The organic electroluminescent element described in claim 1, wherein at least one of the one or more organic layers has a density of 1.10 to 1.15 g/cm$^3$.

7. The organic electroluminescent element described in claim 6, wherein the at least one of the one or more organic layers which have a density of 1.10 to 1.15 g/cm$^3$ is a light emission layer which contains a dopant and a host compound having a band gap of 2.5 to 3.8 eV, and wherein the host compound has a molecular weight of 5,000 to 1,000,000.

8. The organic electroluminescent element described in claim 1, wherein the substrate has a gas barrier layer.

9. The organic electroluminescent element described in claim 1, wherein the light emitted from the organic electroluminescent element is red.

10. The organic electroluminescent element described in claim 1, wherein the light emitted from the organic electroluminescent element is green.

11. The organic electroluminescent element described in claim 1, wherein the light emitted from the organic electroluminescent element is blue.

12. The organic electroluminescent element described in claim 1, wherein the light emitted from the organic electroluminescent element is white.

13. A displaying device having the organic electroluminescent element described in claim 1.

14. A lighting device having the organic electroluminescent element described in claim 1.

15. A displaying device having the lighting device described in claim 14 and a liquid crystal element as the displaying means.

16. The organic electroluminescent element described in claim 1, wherein the light emission layer contains an organic solvent in an amount of from $10^{-2}$ to $10^3$ ppm.

* * * * *